(12) United States Patent
Yoon et al.

(10) Patent No.: US 9,978,684 B2
(45) Date of Patent: May 22, 2018

(54) SEMICONDUCTOR DEVICES

(71) Applicant: Samsung Electronics Co., Ltd., Suwon-Si, Gyeonggi-do (KR)

(72) Inventors: Changseop Yoon, Yangsan-si (KR); Hyung Jong Lee, Osan-si (KR); Boram Im, Yeoju-si (KR)

(73) Assignee: Samsung Electronics Co., Ltd. (KR)

( * ) Notice: Subject to any disclaimer, the term of this patent is extended or adjusted under 35 U.S.C. 154(b) by 0 days. days.

(21) Appl. No.: 15/082,820

(22) Filed: Mar. 28, 2016

(65) Prior Publication Data

US 2016/0293546 A1 Oct. 6, 2016

(30) Foreign Application Priority Data

Apr. 1, 2015 (KR) .................. 10-2015-0046283

(51) Int. Cl.

| | | |
|---|---|---|
| *H01L 23/52* | (2006.01) | |
| *H01L 23/528* | (2006.01) | |
| *H01L 23/535* | (2006.01) | |
| *H01L 23/532* | (2006.01) | |
| *H01L 29/78* | (2006.01) | |
| *H01L 21/8238* | (2006.01) | |
| *H01L 27/02* | (2006.01) | |
| *H01L 29/165* | (2006.01) | |

(52) U.S. Cl.
CPC .. *H01L 23/5283* (2013.01); *H01L 21/823871* (2013.01); *H01L 23/535* (2013.01); *H01L 23/53266* (2013.01); *H01L 27/0207* (2013.01); *H01L 29/7851* (2013.01); *H01L 29/165* (2013.01); *H01L 29/7848* (2013.01)

(58) Field of Classification Search
CPC ............ H01L 23/535; H01L 23/53266; H01L 29/7851; H01L 23/5283
See application file for complete search history.

(56) References Cited

U.S. PATENT DOCUMENTS

| | | |
|---|---|---|
| 8,450,124 B2 | 5/2013 | Hoentschel et al. |
| 8,610,241 B1 | 12/2013 | Hu et al. |
| 8,723,225 B2 | 5/2014 | Hu et al. |
| 8,779,517 B2 | 7/2014 | Lin et al. |

(Continued)

FOREIGN PATENT DOCUMENTS

| | | |
|---|---|---|
| KR | 10-2016-0003978 | 1/2016 |
| KR | 10-2016-0028077 | 3/2016 |

*Primary Examiner* — Julia Slutsker
(74) *Attorney, Agent, or Firm* — Ward and Smith, P.A.

(57) ABSTRACT

The inventive concepts relate to a semiconductor device including a field effect transistor and a method for manufacturing the same. The semiconductor device includes a substrate including first and second source/drain regions formed thereon, a gate electrode intersecting the substrate between the first and second source/drain regions, and an active contact electrically connecting the first and second source/drain regions to each other. The active contact is spaced apart from the gate electrode. The active contact includes first sub-contacts provided on the first and second source/drain regions so as to be connected to the first and second source/drain regions, respectively, a second sub-contact provided on the first sub-contacts to electrically connect the first sub-contacts to each other, and a barrier layer provided between the second sub-contact and each of the first sub-contacts.

18 Claims, 30 Drawing Sheets

(56) References Cited

U.S. PATENT DOCUMENTS

| | | |
|---|---|---|
| 8,863,063 B2 | 10/2014 | Becker et al. |
| 8,987,831 B2 | 3/2015 | Liaw |
| 9,018,713 B2 | 4/2015 | Erickson et al. |
| 9,041,115 B2 | 5/2015 | Liaw |
| 2007/0020829 A1* | 1/2007 | Hotta ................ H01L 21/76808 438/172 |
| 2009/0014796 A1* | 1/2009 | Liaw ....................... H01L 27/11 257/347 |
| 2012/0223406 A1* | 9/2012 | Warabino ............ H01L 23/3677 257/506 |
| 2014/0306296 A1 | 10/2014 | Jeon et al. |
| 2014/0332871 A1* | 11/2014 | Kim .................... H01L 23/5256 257/296 |
| 2015/0187905 A1* | 7/2015 | Cai ..................... H01L 29/6681 257/288 |
| 2016/0005851 A1 | 1/2016 | Song et al. |
| 2016/0035623 A1* | 2/2016 | Shao ................. H01L 21/76879 257/774 |
| 2016/0064378 A1 | 3/2016 | Kwon et al. |
| 2016/0111341 A1* | 4/2016 | Kim .................... H01L 27/0207 257/369 |

* cited by examiner

SEMICONDUCTOR DEVICES

CROSS-REFERENCE TO RELATED APPLICATION

This U.S. non-provisional patent application claims priority under 35 U.S.C. § 119 to Korean Patent Application No. 10-2015-0046283, filed on Apr. 1, 2015, in the Korean Intellectual Property Office, the disclosure of which is hereby incorporated by reference in its entirety.

BACKGROUND

Embodiments of the inventive concepts relate to a semiconductor device and to methods of forming semiconductor devices. More particularly, embodiments of the inventive concepts relate to semiconductor devices including field effect transistors and methods of forming the same.

Semiconductor devices are widely used in the electronic industry because of their small size, multi-functional capabilities, and low manufacturing costs. Some semiconductor devices may be categorized as semiconductor memory devices that store logical data, semiconductor logic devices that process logical data, and hybrid semiconductor devices having both the function of semiconductor memory devices to store logical data and the function of semiconductor logic devices to process logical data. The demand for semiconductor devices with excellent operational characteristics has been increasing with the development of the electronic industry. For example, demand has increased for semiconductor devices with high reliability, high speed, and/or greater functionality. To satisfy these demands, structures in semiconductor devices have become more complicated and semiconductor devices have become more highly integrated.

SUMMARY

Embodiments of the inventive concepts may provide a semiconductor device including an active contact that crosses over a gate electrode and connects a pair of source/drain regions to each other.

Embodiments of the inventive concepts may provide a method for manufacturing a semiconductor device, which includes a method of forming an active contact using patterning processes different from each other.

In one aspect, a semiconductor device may include a substrate including first and second source/drain regions formed thereon, a gate electrode crossing over the substrate between the first and second source/drain regions, and an active contact electrically connecting the first and second source/drain regions to each other. The active contact may be spaced apart from the gate electrode. The active contact may include first sub-contacts provided on the first and second source/drain regions so as to be connected to the first and second source/drain regions, respectively, a second sub-contact provided on the first sub-contacts to electrically connect the first sub-contacts to each other, and a barrier layer provided between the second sub-contact and each of the first sub-contacts.

In an embodiment, the substrate may include an active pattern formed thereon, and the active pattern may extend in a first direction parallel to a top surface of the substrate. The active pattern may include the first and second source/drain regions, and the gate electrode may extend in a second direction crossing over the first direction.

In an embodiment, the gate electrode may cross over the active pattern, and the first and second source/drain regions may be disposed at opposite sides of the gate electrode, respectively. The active pattern may include a channel region formed between the first and second source/drain regions. The channel region may vertically overlap with the gate electrode.

In an embodiment, the active pattern may include first and second active patterns that are spaced apart from each other with the gate electrode interposed therebetween. The first and second active patterns may include the first and second source/drain regions, respectively, and the gate electrode may extend in the second direction on a device isolation layer between the first and second active patterns.

In an embodiment, the semiconductor device may further include an insulating pattern between the gate electrode and the device isolation layer. A bottom surface of a portion of the gate electrode may be higher than top surfaces of the first and second active patterns. The portion may be disposed on the insulating pattern.

In an embodiment, the gate electrode may include a plurality of gate electrodes crossing over the substrate between the first and second source/drain regions, and the second sub-contact may cross over the plurality of gate electrodes when viewed from a plan view.

In an embodiment, the gate electrode may include a plurality of gate electrodes crossing over the substrate between the first and second source/drain regions, and the semiconductor device may further include a capping layer covering top surfaces of the plurality of gate electrodes. The first sub-contacts may penetrate the capping layer so as to be connected to the first and second source/drain regions, respectively.

In an embodiment, a bottom surface of the second sub-contact may be higher than a top surface of the gate electrode.

In an embodiment, the first sub-contact and the second sub-contact may include conductive materials different from each other, and the barrier layer may substantially prevent a material from being diffused between the second sub-contact and the first sub-contacts.

In an embodiment, the semiconductor device may further include a via provided on the active contact, and a conductive line provided on the via so as to be electrically connected to the first and second source/drain regions through the via and the active contact.

In an embodiment, the active contact may have one sidewall adjacent to the first source/drain region or the second source/drain region when viewed from a cross-sectional view taken along a specific direction. The one sidewall may have a stepped profile.

In another aspect, a method for manufacturing a semiconductor device may include forming first and second source/drain regions on a substrate, forming a gate electrode crossing over the substrate between the first and second source/drain regions, and forming an active contact electrically connecting the first and second source/drain regions to each other. Forming the active contact may include forming first sub-contacts connected to the first and second source/drain regions, respectively, forming an interlayer insulating layer and a mask layer that cover the first sub-contacts, forming a first mask hole and a second mask hole by performing a first patterning process and a second patterning process on the mask layer, respectively, wherein a mask pattern defining the first and second mask holes is formed from the mask layer by the first and second patterning processes, and forming a sub-contact hole by etching the interlayer insulating layer using the mask pattern as an etch mask.

In an embodiment, at least one of the first and second mask holes may overlap with at least one of the first sub-contacts. The first and second mask holes may be connected to each other to constitute one communicating hole, and the sub-contact hole may be superimposed on the communicating hole.

In an embodiment, forming the second mask hole may include forming a vertical extension hole that vertically extends from a portion of a bottom surface of the first mask hole toward the substrate.

In an embodiment, the first patterning process may use a first layout defining a first position at which the first mask hole is formed, and the second patterning process may use a second layout defining a second position at which the second mask hole is formed. The first and second layouts may partially overlap with each other, and the vertical extension hole may be formed at a third position. The third position may be superimposed on an overlapping region of the first and second layouts.

In an embodiment, the method may further include forming a trench in an upper portion of the substrate to define active patterns, forming a device isolation layer filling the trench, and forming an insulating pattern on the device isolation layer between the active patterns adjacent to each other. The first and second source/drain regions may be formed in upper portions of the adjacent active patterns, respectively. The gate electrode may cross over the insulating pattern between the adjacent active patterns, and a top surface of the insulating pattern may be higher than top surfaces of the adjacent active patterns.

In an embodiment, forming the active contact may further include conformally forming a barrier layer in the sub-contact hole, and forming a second sub-contact filling the sub-contact hole on the barrier layer.

In still another aspect, a semiconductor device may include a substrate including first and second active patterns that are formed thereon and include first and second source/drain regions, respectively, a device isolation layer disposed in the substrate to define the first and second active patterns, a gate electrode crossing over the device isolation layer between the first and second active patterns, and an active contact electrically connecting the first and second source/drain regions to each other. The active contact may be spaced apart from the gate electrode. The active contact may include first sub-contacts provided on the first and second source/drain regions so as to be connected to the first and second source/drain regions, respectively, and a second sub-contact provided on the first sub-contacts to electrically connect the first sub-contacts to each other. The second sub-contact may cross over the device isolation layer and the gate electrode when viewed from a plan view.

In an embodiment, the first and second active patterns may extend in a first direction parallel to a top surface of the substrate and may be spaced apart from each other in the first direction. The gate electrode may extend in a second direction intersecting the first direction.

In an embodiment, a bottom surface of a portion of the gate electrode may be higher than top surfaces of the first and second active patterns. The portion may be disposed on the device isolation layer.

In an embodiment, the gate electrode may include a plurality of gate electrodes crossing over the substrate between the first and second active patterns, and the second sub-contact may cross over the plurality of gate electrodes when viewed from a plan view.

In an embodiment, the semiconductor device may further include a capping layer covering top surfaces of the plurality of gate electrodes. The first sub-contacts may penetrate the capping layer so as to be connected to the first and second source/drain regions, respectively.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
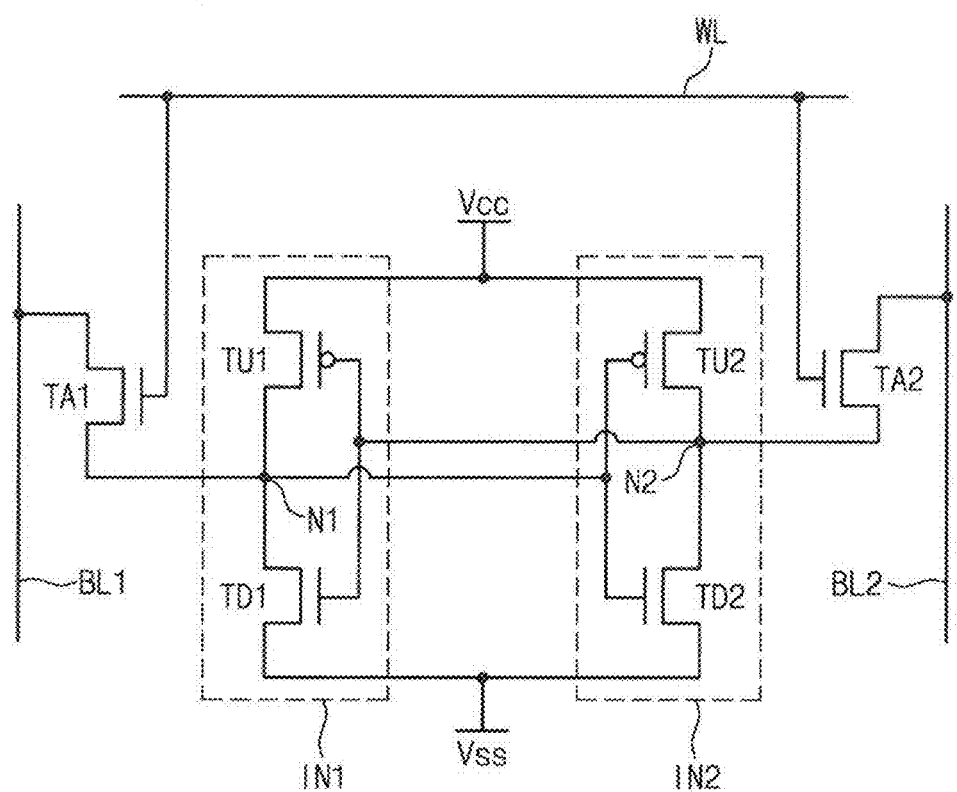
FIG. 1 is an equivalent circuit diagram illustrating a static random access memory (SRAM) cell according to example embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is an equivalent circuit diagram illustrating a static random access memory (SRAM) cell according to example embodiments of the inventive concepts.

Referring to FIG. 1, a SRAM cell according to embodiments of the inventive concepts may include a first pull-up transistor TU1, a first pull-down transistor TD1, a second pull-up transistor TU2, a second pull-down transistor TD2, a first access transistor TA1, and a second access transistor TA2. The first and second pull-up transistors TU1 and TU2 may be P-type metal-oxide-semiconductor (PMOS) transistors, but the first and second pull-down transistors TD1 and TD2 and the first and second access transistors TA1 and TA2 may be N-type MOS (NMOS) transistors.

A first source/drain of the first pull-up transistor TU1 and a first source/drain of the first pull-down transistor TD1 may be connected to a first node N1. A second source/drain of the first pull-up transistor TU1 may be connected to a power line Vcc, and a second source/drain of the first pull-down transistor TD1 may be connected to a ground line Vss. A gate of the first pull-up transistor TU1 may be electrically connected to a gate of the first pull-down transistor TD1. Thus, the first pull-up transistor TU1 and the first pull-down transistor TD1 may constitute a first inverter IN1. The gates of the first pull-up and first pull-down transistors TU1 and TD1, which are connected to each other, may correspond to an input terminal of the first inverter IN1. The first node N1 may correspond to an output terminal of the first inverter IN1.

A first source/drain of the second pull-up transistor TU2 and a first source/drain of the second pull-down transistor TD2 may be connected to a second node N2. A second source/drain of the second pull-up transistor TU2 may be connected to the power line Vcc, and a second source/drain of the second pull-down transistor TD1 may be connected to the ground line Vss. A gate of the second pull-up transistor TU2 may be electrically connected to a gate of the second pull-down transistor TD2. Thus, the second pull-up transistor TU2 and the second pull-down transistor TD2 may constitute a second inverter IN2. The gates of the second pull-up and second pull-down transistors TU2 and TD2, which are connected to each other, may correspond to an input terminal of the second inverter IN2. The second node N2 may correspond to an output terminal of the second inverter IN2.

The first and second inverter may be combined with each other to constitute a latch structure. In other words, the gates of the first pull-up and first pull-down transistors TU1 and TD1 may be electrically connected to the second node N2, and the gates of the second pull-up and second pull-down transistors TU2 and TD2 may be electrically connected to the first node N1. A first source/drain of the first access transistor TA1 may be connected to the first node N1, and a second source/drain of the first access transistor TA1 may be connected to a first bit line BL1. A first source/drain of the second access transistor TA2 may be connected to the second node N2, and a second source/drain of the second access transistor TA2 may be connected to a second bit line BL2. Gates of the first and second access transistors TA1 and TA2 may be electrically connected to a word line WL. As a result, an SRAM cell according to embodiments of the inventive concepts may be realized.

Figure 2:
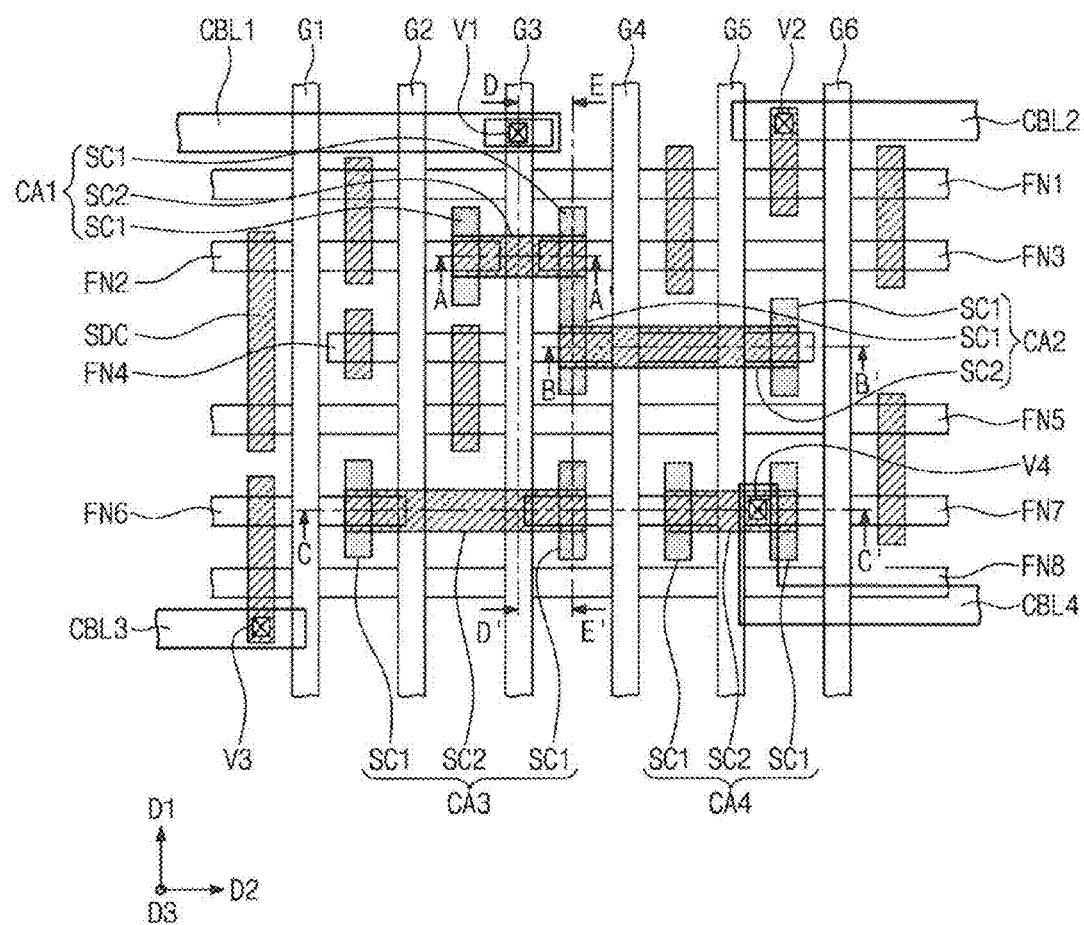
FIG. 2 is a plan view illustrating a semiconductor device according to example embodiments of the inventive concepts.
Figure 3A:
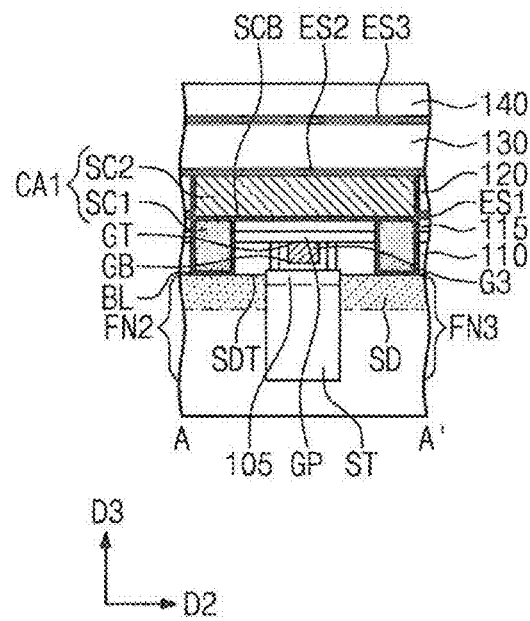
FIGS. 3A, 3B, 3C, 3D, and 3E are cross-sectional views taken along lines A-A', B-B', C-C', D-D', and E-E' of FIG. 2, respectively.
Figure 3B:
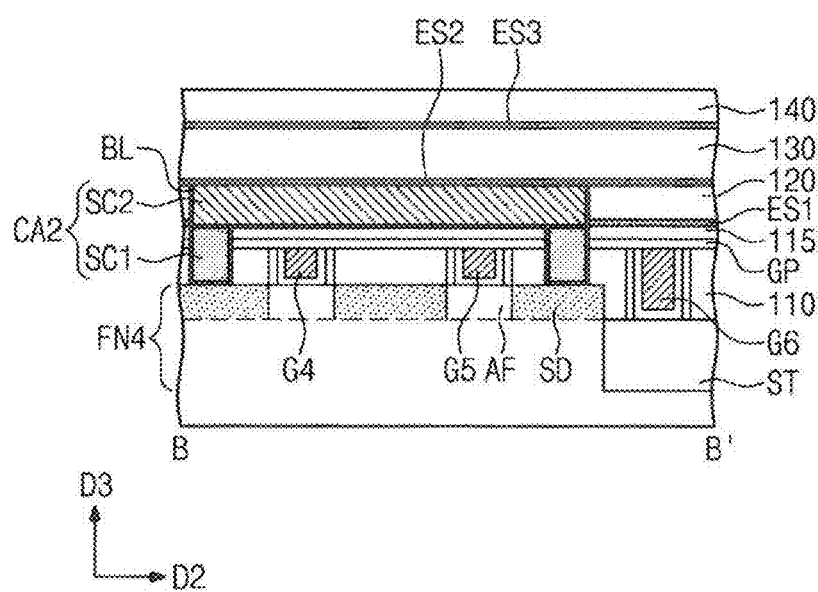
Figure 3C:
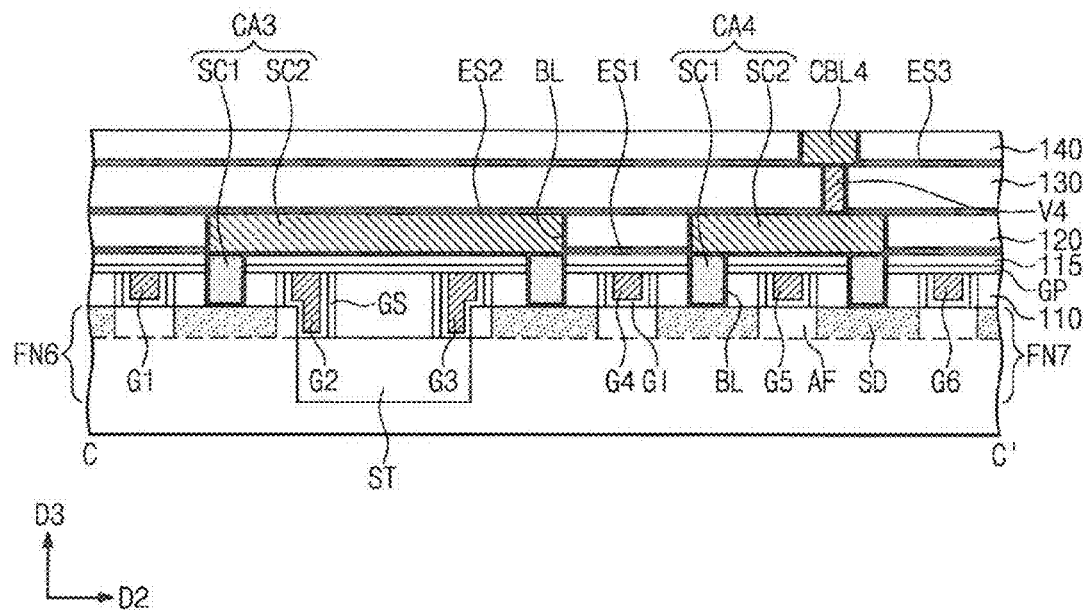

FIG. 2 is a plan view illustrating a semiconductor device according to example embodiments of the inventive concepts. FIGS. 3A, 3B, 3C, 3D, and 3E are cross-sectional views taken along lines A-A', B-B', C-C', D-D', and E-E' of FIG. 2, respectively. FIGS. 4A, 4B, and 4C are cross-sectional views corresponding to the line A-A' of FIG. 2 to illustrate modified embodiments of a semiconductor device according to example embodiments of the inventive concepts.

Referring to FIGS. 2 and 3A to 3E, one logic cell is illustrated in FIGS. 2 and 3A to 3E. The logic cell may correspond to a unit for performing one logic operation. For example, the logic cell may include the SRAM cell described with reference to FIG. 1.

A device isolation layer ST may be provided in a substrate 100 to define active patterns FN1 to FN8. For example, the substrate 100 may be a silicon substrate, a germanium substrate, or a silicon-on-insulator (SOI) substrate. The device isolation layer ST may be formed in an upper portion of the substrate 100. For example, the device isolation layer ST may include a silicon oxide layer. The active patterns FN1 to FN8 may include first to eighth active patterns FN1 to FN8 extending in a second direction D2 parallel to a top surface of the substrate 100. The active patterns FN1 to FN8 may be arranged in a first direction D1 intersecting the second direction D2. The first direction D1 may be parallel to the top surface of the substrate 100. The device isolation layer ST may be disposed at opposite sides of each of the active patterns FN1 to FN8.

The second active pattern FN2 and the third active pattern FN3 may be spaced apart from each other in the second direction D2 with the device isolation layer ST interposed therebetween. The second and third active patterns FN2 and FN3 may be disposed between the first and fourth active patterns FN1 and FN4. The sixth active pattern FN6 and the seventh active pattern FN7 may be spaced apart from each other in the second direction D2 with the device isolation layer ST interposed therebetween. The sixth and seventh active patterns FN6 and FN7 may be disposed between the fifth and eighth active patterns FN5 and FN8. In some embodiments, upper portions of the active patterns FN1 to FN8 may have fin shapes protruding from the device isolation layer ST.

In some embodiments, each of the active patterns FN1 to FN8 may define a PMOSFET region or an NMOSFET region. For example, the second, third, fourth, and eighth active patterns FN2, FN3, FN4, and FN8 may define the PMOSFET regions, and the first, fifth, sixth, and seventh active patterns FN1, FN5, FN6, and FN7 may define the NMOSFET regions. Distances between the active patterns FN1 to FN8 may be varied according to types of the regions of the active patterns FN1 to FN8. For example, the first active pattern FN1 may correspond to the NMOSFET region, and the third active pattern FN3 may correspond to the PMOSFET region different from the NMOSFET region. In this case, the distance between the first and third active patterns FN1 and FN3 may be defined as a first distance. The third and fourth active patterns FN3 and FN4 may correspond to the PMOSFET regions. In other words, the third and fourth active pattern FN3 and FN4 may correspond to the same kind of regions. In this case, the distance between the third and fourth active patterns FN3 and FN4 may be defined as a second distance. Here, the second distance may be greater than the first distance.

Gate electrodes G1 to G6 may be provided on the active patterns FN1 to FN8. The gate electrodes G1 to G6 may extend in the first direction D1 to cross over the active patterns FN1 to FN8. The gate electrodes G1 to G6 may be spaced apart from each other in the second direction D2. The gate electrodes G1 to G6 may include first to sixth gate electrodes G1 to G6 that cross over the active patterns FN1 to FN8 and the device isolation layer ST.

A gate insulating pattern GI may be provided under each of the gate electrodes G1 to G6, and gate spacers GS may be provided on opposite sidewalls of each of the gate electrodes G1 to G6. A first interlayer insulating layer 110 may be provided to fill spaces between the gate electrodes G1 to G6. A capping layer GP may be provided on the first interlayer insulating layer 110 to cover top surfaces of the gate electrodes G1 to G6. Second, third, fourth, and fifth interlayer insulating layers 115, 120, 130, and 140 may be sequentially stacked on the capping layer GP. A first etch stop layer ES1 may be disposed between the second and third interlayer insulating layers 115 and 120, a second etch stop layer ES2 may be disposed between the third and fourth interlayer insulating layers 120 and 130, and a third etch stop layer ES3 may be disposed between the fourth and fifth interlayer insulating layers 130 and 140.

The gate electrodes G1 to G6 may include at least one of a doped semiconductor material, a metal, or a conductive metal nitride. The gate insulating pattern GI may include at least one of a silicon oxide layer, a silicon oxynitride layer, or a high-k dielectric layer having a dielectric constant higher than that of the silicon oxide layer. Each of the capping layer GP and the gate spacer GS may include at least one of a silicon oxide layer, a silicon nitride layer, or a silicon oxynitride layer. Each of the first to fifth interlayer insulating layers 110, 115, 120, 130, and 140 may include a silicon oxide layer or a silicon oxynitride layer. Each of the first to third etch stop layers ES1, ES2, and ES3 may include silicon carbonitride (SiCN).

Source/drain regions SD may be provided in upper portions of the active patterns FN1 to FN8 on opposite sides of each of the gate electrodes G1 to G6. As illustrated in FIGS. 3A, 3B, and 3E, the source/drain regions SD may be confined in the active patterns FN1 to FN8. Alternatively, the source/drains SD may extend onto the substrate 100. In some embodiments, the source/drain regions SD in the second, third, fourth, and eighth active patterns FN2, FN3, FN4, and FN8 may be P-type dopant regions, and the source/drain regions SD in the first, fifth, sixth, and seventh active patterns FN1, FN5, FN6, and FN7 may be N-type dopant regions.

Upper portions of the active patterns FN1 to FN8 other than the source/drain regions SD may be defined as channel regions AF. The channel regions AF may be disposed under the gate electrodes G1 to G6 and may vertically overlap with the gate electrodes G1 to G6. Each of the channel regions AF may be disposed between the source/drain regions SD.

In some embodiments, the source/drain regions SD may be formed by implanting dopant ions into the active patterns FN1 to FN8 using the gate electrodes G1 to G6 as an ion implantation mask. In other embodiments, the source/drain regions SD may include epitaxial patterns formed by a selective epitaxial growth (SEG) process. In this case, upper portions of the active patterns FN1 to FN8 at opposite sides of gate electrodes G1 to G6 may be removed, and then, the SEG process may be performed to form the source/drain regions SD on lower portions of active patterns FN1 to FN8 at opposite sides of the gate electrodes G1 to G6. Thus, even though not shown in the drawings, top surfaces SDT of the source/drain regions SD may be disposed at a higher level than top surfaces of the channel regions AF. The epitaxial patterns may be defined as upper portions of the active patterns FN1 to FN8 at opposite sides of the gate electrodes G1 to G6. When the source/drain regions SD include the epitaxial patterns, the source/drain regions SD may include a different semiconductor element from the substrate 100.

In some embodiments, the source/drain regions SD may include a semiconductor element of which a lattice constant is greater or smaller than that of a semiconductor element of the substrate 100. Since the source/drain regions SD may include the different semiconductor element from the substrate 100, the source/drain regions SD may provide compressive force or tensile force to the channel regions AF. For example, if the substrate 100 is a silicon substrate, the source/drain regions SD of the second, third, fourth, and eighth active patterns FN2, FN3, FN4, and FN8 corresponding to the PMOSFET regions may include embedded silicon-germanium (SiGe) or germanium (Ge). In this case, the source/drain regions SD may provide a compressive force to the channel regions AF of the second, third, fourth, and eighth active patterns FN2, FN3, FN4, and FN8. If the substrate 100 is the silicon substrate, the source/drain regions SD of the first, fifth, sixth, and seventh active patterns FN1, FN5, FN6, and FN7 corresponding to the NMOSFET regions may include silicon carbide (SiC). In this case, the source/drain regions SD may provide a tensile force to the channel regions AF of the first, fifth, sixth, and seventh active patterns FN1, FN5, FN6, and FN7. As described above, since the source/drain regions SD may provide a compressive force or the tensile force to the channel regions AF, mobility of carriers generated in the channel regions AF may be improved when the field effect transistors according to embodiments of the inventive concepts are operated.

Source/drain contacts SDC may be provided at opposite sides of each of the gate electrodes G1 to G6. In some embodiments, some of the source/drain contacts SDC may be disposed to correspond to some of the source/drain regions SD, respectively. In other words, some of the source/drain contacts SDC may be spaced apart from each other in the first direction D1, like the source/drain regions SD. Moreover, each of others of the source/drain contacts SDC may electrically connect source/drain regions SD that are spaced apart from each other in the first direction D1 to each other. For example, the source/drain contact SDC disposed on the source/drain regions SD may electrically connect the source/drain regions SD of the first and second active patterns FN1 and FN2 to each other (see FIG. 2).

Although not shown in the drawings, the source/drain contacts SDC may be in direct contact with the source/drain regions SD. In this case, the source/drain contacts SDC may extend completely through the first to third interlayer insulating layers 110, 115, and 120 to contact the source/drain regions SD. Top surfaces of the source/drain contacts SDC may be disposed at substantially the same level as top surfaces of second sub-contacts SC2 to be described later. The source/drain contacts SDC may include at least one of a doped semiconductor material, a metal, or a conductive metal nitride.

In other embodiments, connection conductive patterns (not shown) may be provided between the source/drain contacts SDC and the source/drain regions SD. The source/drain contacts SDC may be electrically connected to the source/drain regions SD through the connection conductive patterns. In this case, the connection conductive patterns may be provided in the first and second interlayer insulating layers 110 and 115, and the source/drain contacts SDC may be provided in the third interlayer insulating layer 120. The connection conductive patterns may be disposed at the same level as first sub-contacts SC1 to be described later. The connection conductive patterns may include a metal silicide. For example, the connection conductive patterns may include at least one of titanium silicide, tantalum silicide, or tungsten silicide.

Figure 3D:
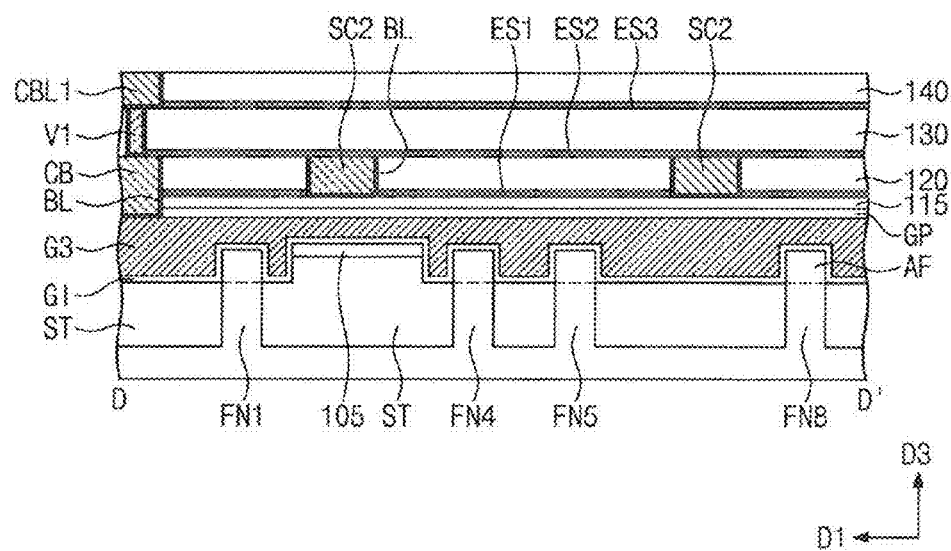
Figure 3E:
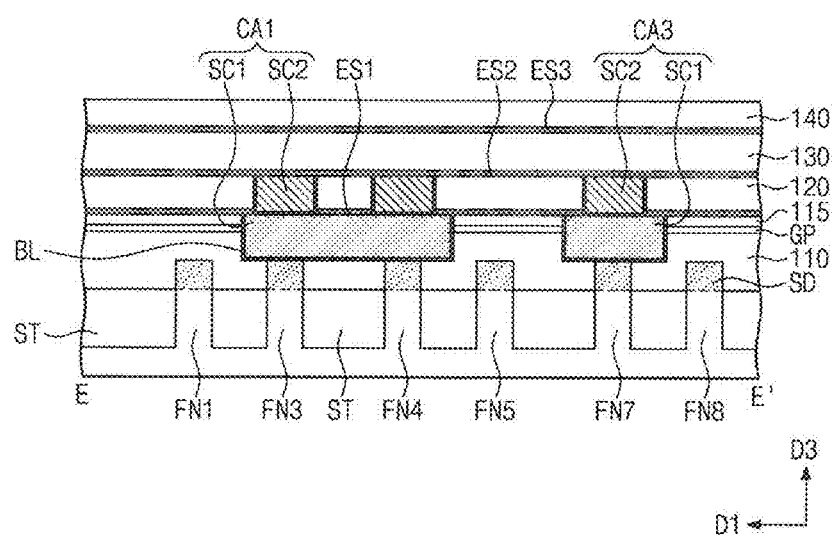
Figure 4A:
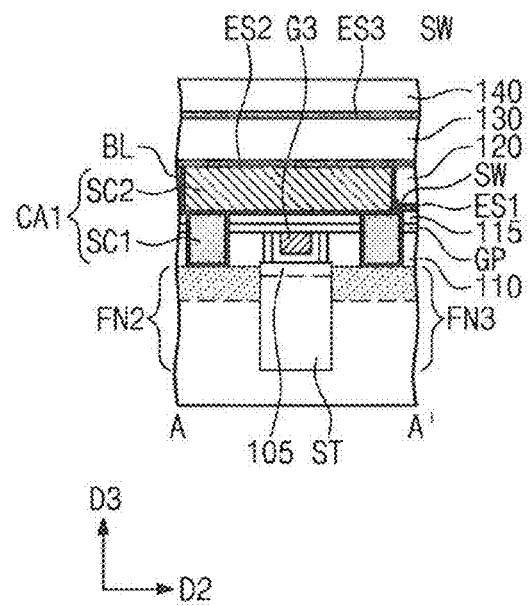
FIGS. 4A, 4B, and 4C are cross-sectional views corresponding to the line A-A' of FIG. 2 to illustrate modified embodiments of a semiconductor device according to example embodiments of the inventive concepts.
Figure 4B:
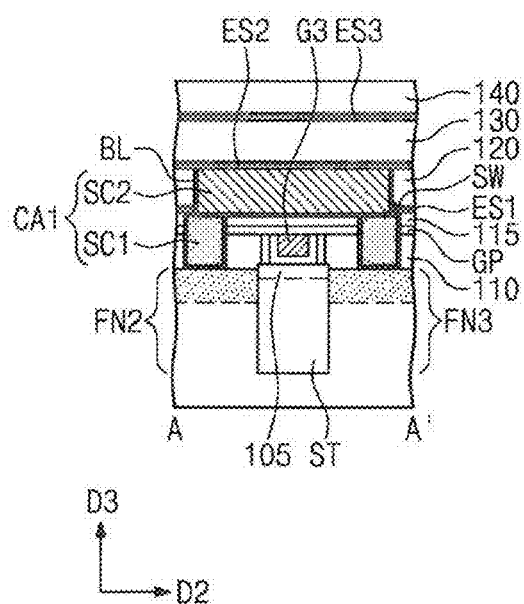
Figure 4C:
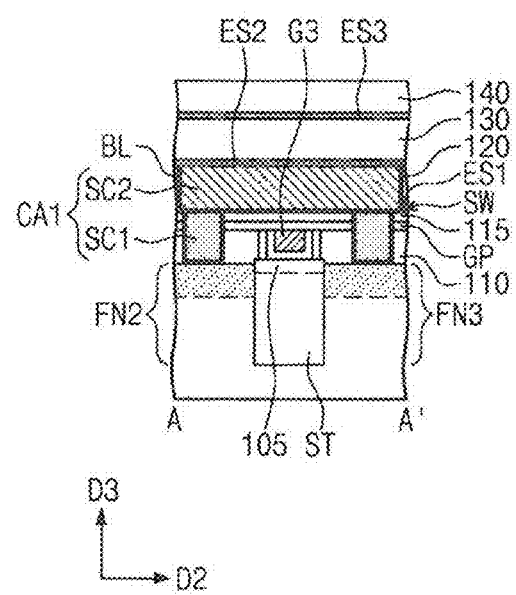

Referring to FIG. 3D, a gate contact CB may be provided on at least one of the gate electrodes G1 to G6. For example, the gate contact CB may be disposed on one end portion of the third gate electrode G3, as illustrated in FIG. 3D. The gate contact CB may penetrate the third and second interlayer insulating layers 120 and 115, the first etch stop layer ES1, and the capping layer GP so as to be in direct contact with the top surface of the third gate electrode G3. The third gate electrode G3 may be electrically connected to the first conductive line CBL1 through a first via V1. For example, the gate contact CB may include at least one of a doped semiconductor material, a metal, or a conductive metal nitride.

Referring to FIG. 2, a second via V2 may be provided on the source/drain contact SDC between the fifth and sixth gate electrodes G5 and G6, and a third via V3 may be provided on the source/drain contact SDC adjacent to the first gate electrode G1. Second and third conductive lines CBL2 and CBL3 may be electrically connected to the source/drain regions SD through the second and third vias V2 and V3.

Referring again to FIGS. 2 and 3A to 3E, in some embodiments, a first active contact CA1 may connect the second and third active patterns FN2 and FN3 to each other, and a second active pattern CA2 may be provided on the fourth active pattern FN4 to connect source/drain regions SD on the fourth active pattern FN4 together. A third active contact CA3 may connect the sixth and seventh active patterns FN6 and FN7 to each other, and a fourth active contact CA4 may be provided on the seventh active pattern FN7 to connect source/drain regions SD on the seventh active pattern FN7 together. When viewed from a plan view, the first active contact CA1 may cross over the third gate electrode G3, the second active contact CA2 may cross over the fourth and fifth gate electrodes G4 and G5, the third active contact CA3 may cross over the second and third gate electrodes G2 and G3, and the fourth active contact CA4 may cross over the fifth gate electrode G5.

The first active contact CA1 will now be described in more detail. Referring again to FIGS. 2 and 3A, the first active contact CA1 may electrically connect the source/drain regions SD of the second and third active patterns FN2 and FN3, which are spaced apart from each other with the third gate electrode G3 interposed therebetween. The first active contact CA1 may be spaced apart from the third gate electrode G3 so as to be insulated from the third gate electrode G3. The first active contact CA1 may include first sub-contacts SC1 that are respectively disposed on opposite sides of the third gate electrode G3, and a second sub-contact SC2 that connects the first sub-contacts SC1 to each other. The first sub-contacts SC1 may be in direct contact with the source/drain regions SD of the second and third active patterns FN2 and FN3, respectively, or may contact source/drain regions SD through a barrier layer BL as described below. Both ends of the second sub-contact SC2 may overlap with the first sub-contacts SC1, respectively.

The first sub-contacts SC1 may be provided in the first and second interlayer insulating layers 110 and 115. Top surfaces of the first sub-contacts SC1 may be substantially coplanar with a top surface of the second interlayer insulating layer 115, and bottom surfaces of the first sub-contacts SC1 may be substantially coplanar with a bottom surface of the first interlayer insulating layer 110. The second sub-contact SC2 may be provided in the third interlayer insulating layer 120. A top surface of the second sub-contact SC2 may be substantially coplanar with a top surface of the third interlayer insulating layer 120. A bottom surface SCB of the second sub-contact SC2 may be higher than a top surface GT of the third gate electrode G3.

When viewed from a plan view, one of the first sub-contacts SC1 may be disposed between the second and third gate electrodes G2 and G3 and the other of the first sub-contacts SC1 may be disposed between the third and fourth gate electrodes G3 and G4. The first sub-contacts SC1 may have bar shapes that extend in the first direction D1, i.e., in the same direction as the gate electrodes. In some embodiments, the first sub-contact SC1 between the third and fourth gate electrodes G3 and G4 may extend in the first direction D1, and the extension of the first sub-contact SC1 may be included in the second active contact CA2. Thus, as shown in FIG. 2, the first sub-contact SC1 between the third and fourth gate electrodes G3 and G4 may electrically connect the source/drain regions SD of the third and fourth active patterns FN3 and FN4, which are spaced apart from each other in the first direction D1. When viewed from a plan view, the second sub-contact SC2 may cross over the third gate electrode G3 and may have a bar shape that extends in the second direction D2, i.e., perpendicular to the gate electrodes.

Referring to FIG. 3A, a barrier layer BL may be provided between the first active contact CA1 and the first to third interlayer insulating layers 110, 115, and 120 and between the first active contact CA1 and the source/drain regions SD. The barrier layer BL may have a substantially uniform thickness and may surround the first active contact CA1. In particular, the barrier layer BL may also be disposed between the first and second sub-contacts SC1 and SC2. This is because the first sub-contact SC1 and the second sub-contact SC2 may be independently formed by processes different from each other. However, the top surface of the second sub-contact SC2 may not be covered by the first barrier layer BL.

The first sub-contacts SC and the second sub-contact SC2 may include conductive materials that are different from each other. The barrier layer BL may include a material, such as Ti/TiN, that is capable of substantially preventing a material from diffusing between the first sub-contact SC1 and the second sub-contact SC2. For example, the first sub-contacts SC1 may include a metal silicide. In more detail, the first sub-contacts SC1 may include at least one of titanium silicide, tantalum silicide, or tungsten silicide. The second sub-contact SC2 may include at least one of a doped semiconductor material, a metal, or a conductive metal nitride. In some embodiments, the second sub-contact SC2 may include a metal different from that of the first sub-contacts SC1. For example, the barrier layer BL may include Ti/TiN. Thus, the barrier layer BL may substantially prevent a metal from diffusing between the first sub-contacts SC1 and the second sub-contact SC2.

Referring again to FIG. 3A, an insulating pattern 105 may be provided between the third gate electrode G3 and the device isolation layer ST between the second and third active patterns FN2 and FN3. A bottom surface GB of a portion of the third gate electrode G3 over the insulating pattern 105 may be higher than the top surfaces of the second and third active patterns FN2 and FN3 (e.g., the top surfaces SDT of the source/drain regions SD of the second and third active patterns FN2 and FN3). In some embodiments, a top surface of the device isolation layer ST between the second and third active patterns FN2 and FN3 may be higher than a top surface of the device isolation layer ST of another region (e.g., a top surface of the device isolation layer ST between the sixth and seventh semiconductor patterns FN6 and FN7). Since the second and third active patterns FN2 and FN3 are spaced apart from each other with only the third gate electrode G3 interposed therebetween, they may be relatively close to each other. In other words, a distance between the second and third active patterns FN2 and FN3 may be relatively small. Thus, electrical interaction between the second and third active patterns FN2 and FN3 may be reduced or substantially prevented by the relatively high device isolation layer ST and the insulating pattern 105.

In other embodiments, as illustrated in FIGS. 4A to 4C, the first active contact CA1 may have one sidewall SW adjacent to the third active pattern FN3. The one sidewall SW may have a stepped profile at a position where the first and second sub-contacts SC1 and SC2 are in contact with each other. In more detail, as illustrated in FIG. 4A, the second sub-contact SC2 may be misaligned with the first sub-contacts SC1, so the first active contact CA1 may have a stepped sidewall SW. In another embodiment, as illustrated in FIG. 4B, a second sub-contact SC2 may be formed to be smaller than the second sub-contact SC2 described with reference to FIG. 3A. Thus, the first active contact CA1 may have a stepped sidewall SW. In still another embodiment, as illustrated in FIG. 4C, a second sub-contact SC2 may be formed to be larger than the second sub-contact SC2 described with reference to FIG. 3A. Thus, the first active contact CA1 may have a stepped sidewall SW.

The first active contact CA1 described above may be an example according to some embodiments of the inventive concepts. Hereinafter, the second active contact CA2 according to some embodiments of the inventive concepts will be described in more detail. Hereinafter, some differences between the second active contact CA2 and the first active contact CA1 will be mainly described. In other words, features of the second contact CA2 which are the same as those of the first contact CA1 will be omitted or mentioned briefly for the purpose of ease and convenience in explanation.

Referring again to FIGS. 2 and 3B, the second active contact CA2 may include first and second sub-contacts SC1 and SC2. The second active contact CA2 may electrically connect a pair of the source/drain regions SD, which are spaced apart from each other with the fourth and fifth gate electrodes G4 and G5 interposed therebetween, to each other. At this time, the pair of source/drain regions SD may be provided in a single fourth active pattern FN4. Unlike the first active contact CA1, the second active contact CA2 may cross over two gate electrodes (e.g., the fourth and fifth gate electrodes G4 and G5).

Referring again to FIGS. 2 and 3C, the third active contact CA3 may include first and second sub-contacts SC1 and SC2. The third active contact CA3 may electrically connect the source/drain regions SD of the sixth and seventh active patterns FN6 and FN7, which are spaced apart from each other with the second and third gate electrodes G2 and G3 interposed therebetween, to each other. In other words, the third active contact CA3 may cross over the second and third gate electrodes G2 and G3.

The top surface of the device isolation layer ST between the sixth and seventh active patterns FN6 and FN7 may be lower than the top surface of the device isolation layer ST between the second and third active patterns FN2 and FN3. In addition, the insulating pattern 105 may not be provided on the device isolation layer ST between the sixth and seventh active patterns FN6 and FN7. Thus, bottom surfaces of specific portions of the second and third gate electrodes G2 and G3 may be lower than top surfaces of the sixth and seventh active patterns FN6 and FN7. The specific portions of the second and third gate electrodes G2 and G3 may be on the device isolation layer ST between the sixth and seventh active patterns FN6 and FN7. Since the sixth and seventh active patterns FN6 and FN7 are spaced apart from each other with two gate electrodes (e.g., the second and third gate electrodes G2 and G3) interposed therebetween, they may be relatively far away from each other. In other words, a distance between sixth and seventh active patterns FN6 and FN7 may be relatively great. Thus, electrical interaction between the sixth and seventh active patterns FN6 and FN7 may be reduced or substantially prevented without an additional insulating pattern 105 provided on the device isolation layer ST.

The fourth active contact CA4 may include first and second sub-contacts SC1 and SC2. The fourth active contact CA4 may electrically connect a pair of the source/drain regions SD, which are spaced apart from each other with the fifth gate electrode GS interposed therebetween, to each other. Both the pair of source/drain regions SD may be provided in a single seventh active pattern FN7.

A fourth conductive line CBL4 may be disposed on the fourth active contact CA4. A fourth via V4 may be disposed between the fourth active contact CA4 and the fourth conductive line CBL4. In other words, the fourth via V4 may be disposed on the fourth active contact CA4. The fourth conductive line CBL4 may be electrically connected to the pair of source/drain regions SD through the fourth via V4 and the fourth active contact CA4 so as to exchange input/output signals with the pair of the source/drain regions SD. The fourth via V4 may be provided in the fourth interlayer insulating layer 130, and the fourth conductive line CBL4 may be provided in the fifth interlayer insulating layer 140.

According to the present embodiment, the fourth conductive line CBL4 connected to the fourth active contact CA4 is described as an example. However, the inventive concepts are not limited thereto. The first to third active contacts CA1 to CA3 may also be electrically connected to conductive lines through vias.

Figure 7A:
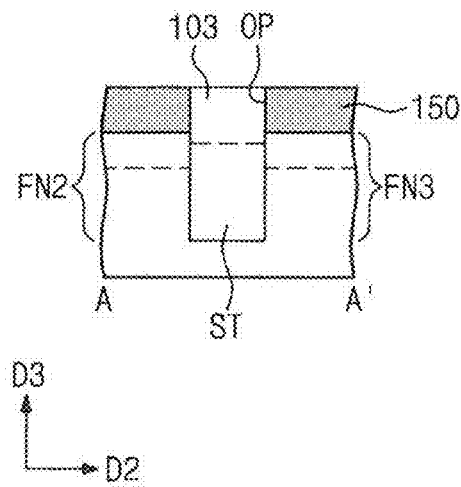
Figure 7B:
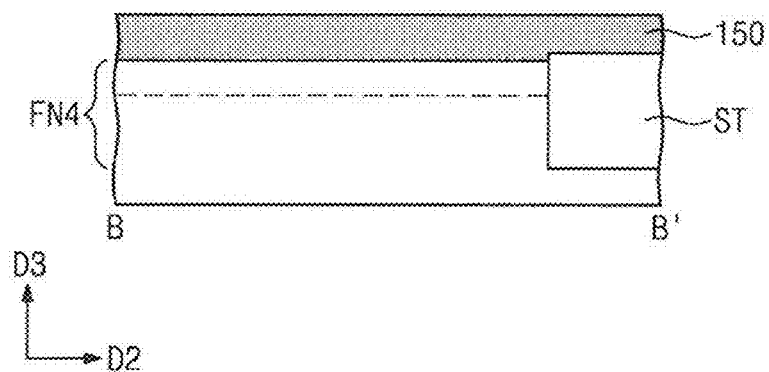
Figure 8A:
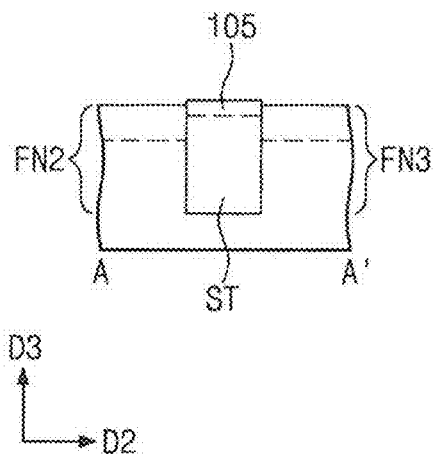
Figure 8B:
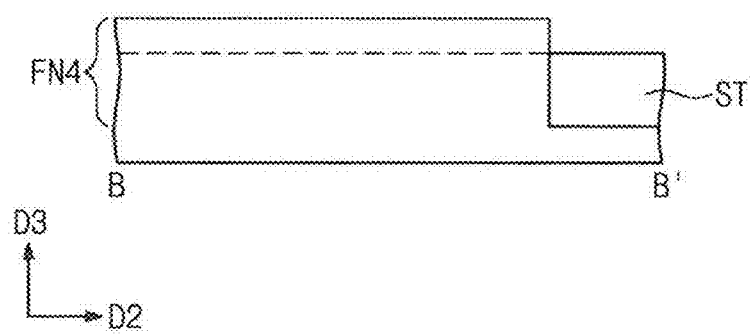
Figure 9:
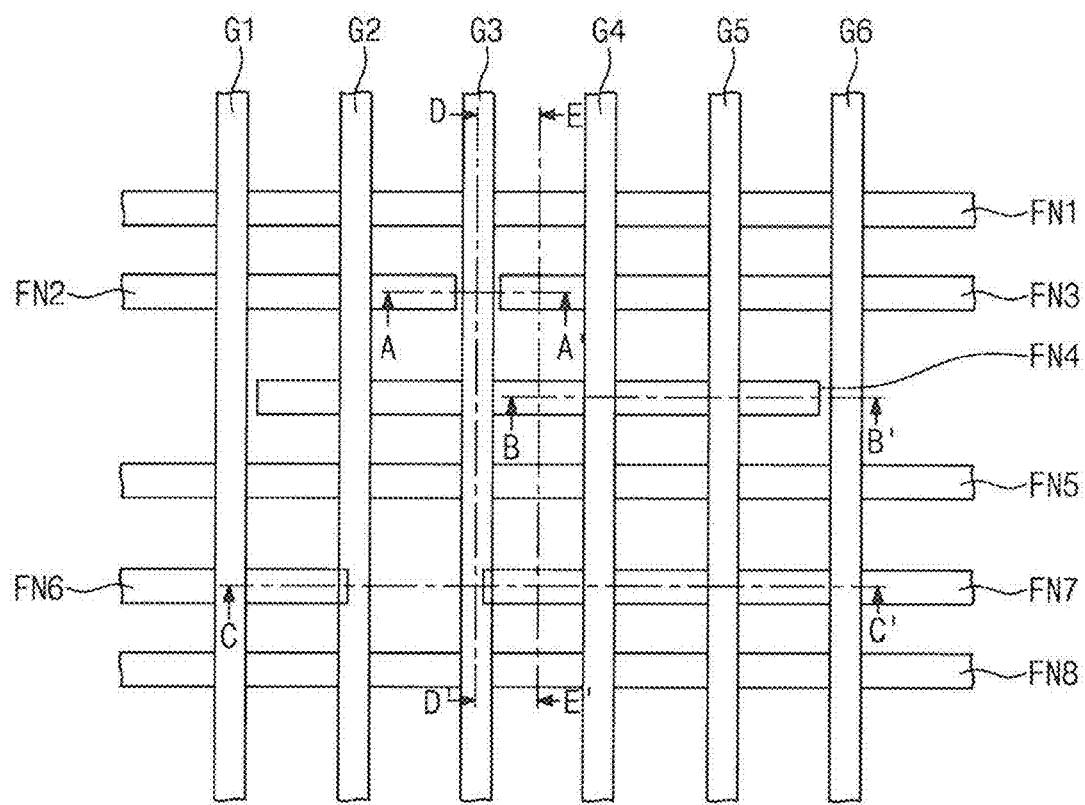
Figure 10A:
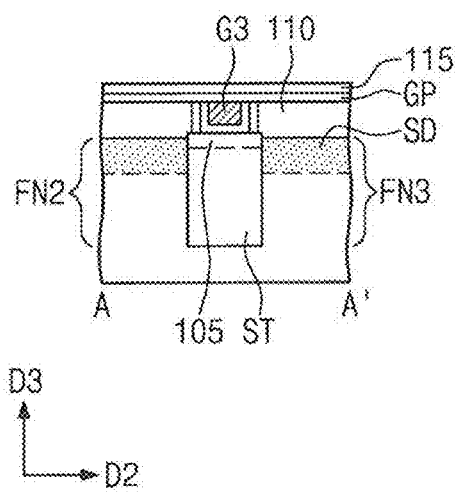
FIGS. 10A, 12A, 14A, and 16A are cross-sectional views taken along lines A-A' of FIGS. 9, 11, 13, and 15, respectively.
Figure 10B:
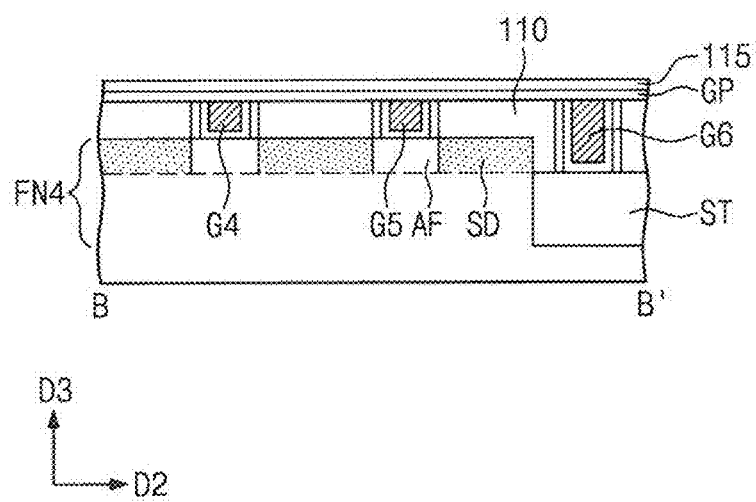
FIGS. 10B, 12B, 14B, and 16B are cross-sectional views taken along lines B-B' of FIGS. 9, 11, 13, and 15, respectively.
Figure 10C:
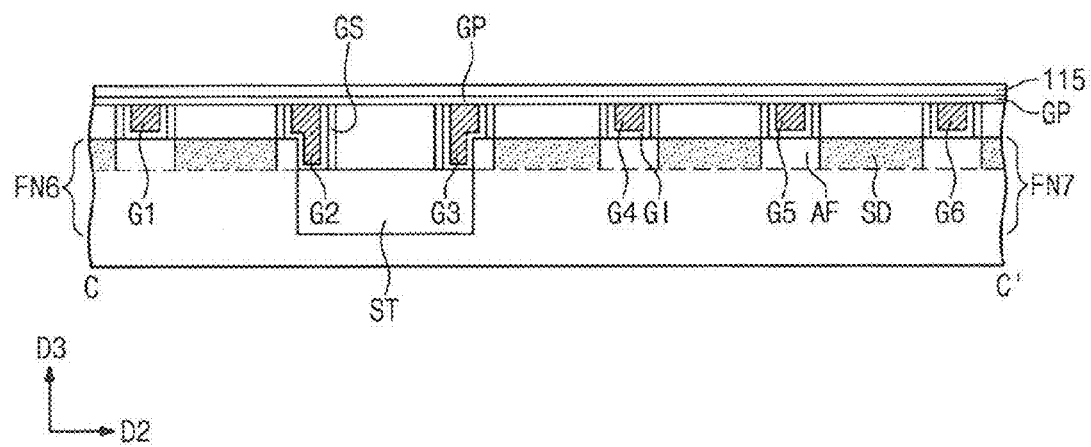
FIGS. 10C, 12C, 14C, and 16C are cross-sectional views taken along lines C-C' of FIGS. 9, 11, 13, and 15, respectively.
Figure 10D:
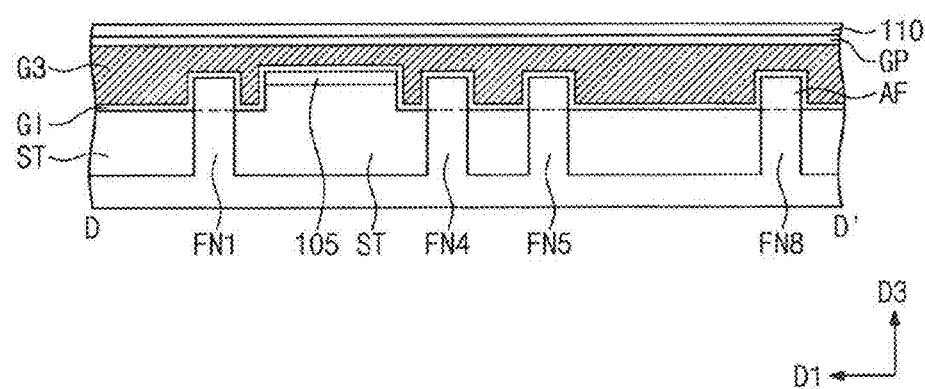
FIGS. 10D, 12D, 14D, and 16D are cross-sectional views taken along lines D-D' of FIGS. 9, 1, 13, and 15, respectively.
Figure 10E:
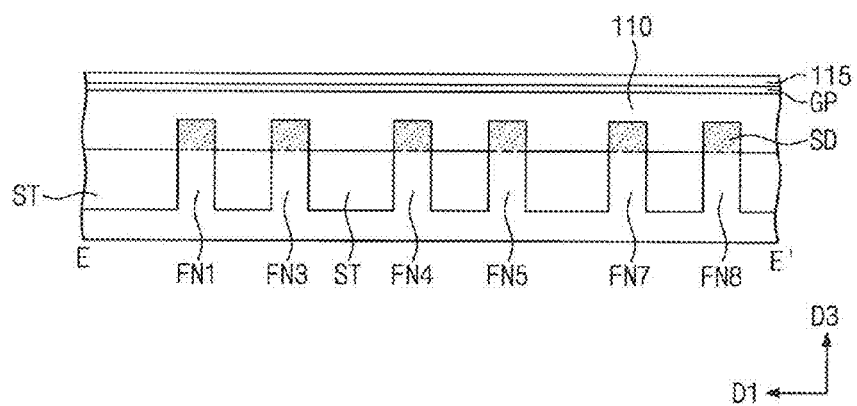
FIGS. 10E, 12E, 14E, and 16E are cross-sectional views taken along lines E-E' of FIGS. 9, 11, 13, and 15, respectively.

FIGS. 5, 9, 11, 13, and 15 are plan views illustrating methods of forming semiconductor devices according to example embodiments of the inventive concepts. FIGS. 6A, 7A, and 8A are cross-sectional views taken along a line A-A' of FIG. 5, and FIGS. 10A, 12A, 14A, and 16A are cross-sectional views taken along lines A-A' of FIGS. 9, 11, 13, and 15, respectively. FIGS. 6B, 7B, and 8B are cross-sectional views taken along a line B-B' of FIG. 5, and FIGS. 10B, 12B, 14B, and 16B are cross-sectional views taken along lines B-B' of FIGS. 9, 11, 13, and 15, respectively. FIGS. 10C, 12C, 14C, and 16C are cross-sectional views taken along lines C-C' of FIGS. 9, 11, 13, and 15, respectively. FIGS. 10D, 12D, 14D, and 16D are cross-sectional views taken along lines D-D' of FIGS. 9, 11, 13, and 15, respectively. FIGS. 10E, 12E, 14E, and 16E are cross-sectional views taken along lines E-E' of FIGS. 9, 11, 13, and 15, respectively.

Figure 5:
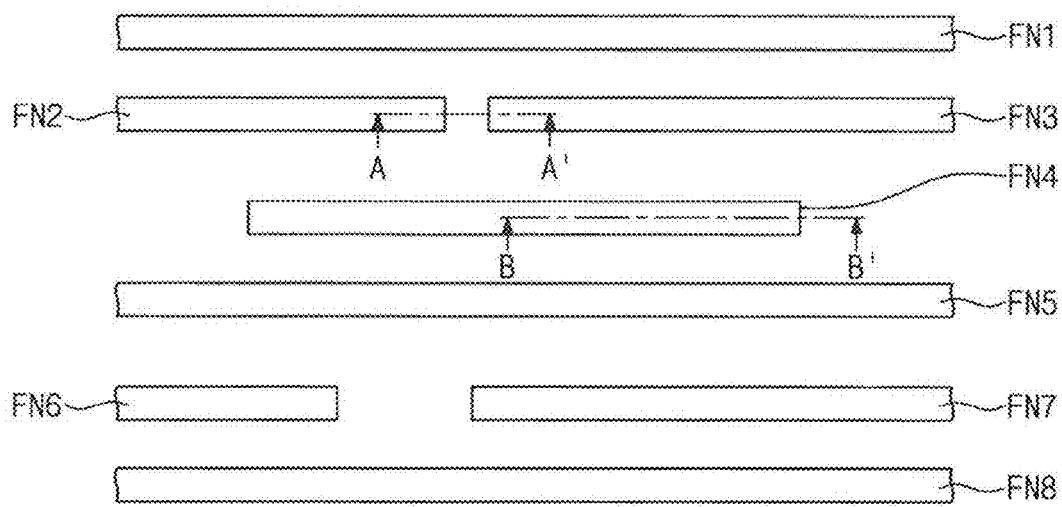
FIGS. 5, 9, 11, 13, and 15 are plan views illustrating a method for manufacturing a semiconductor device according to example embodiments of the inventive concepts.
Figure 5:
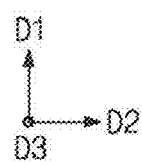
Figure 6A:
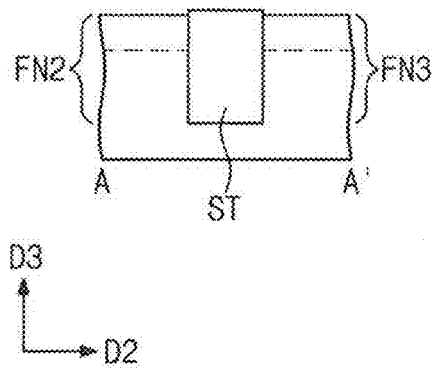
FIGS. 6A, 7A, and 8A are cross-sectional views taken along a line A-A' of FIG. 5.
Figure 6B:
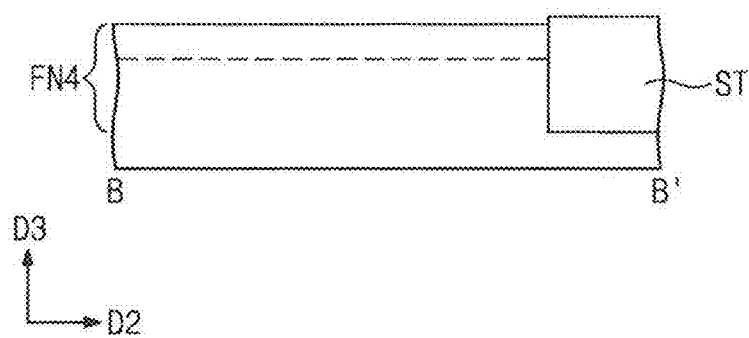
FIGS. 6B, 7B, and 8B are cross-sectional views taken along a line B-B' of FIG. 5.

Referring to FIGS. 5, 6A, and 6B, a device isolation layer ST may be formed in a substrate 100 to define one logic cell. In addition, the device isolation layer ST may also define active patterns FN1 to FN8 on the substrate 100. For example, the substrate 100 may be a silicon substrate, a germanium substrate, or a SOI substrate. The device isolation layer ST may be formed by a shallow-trench isolation (STI) process and may include, for example, a silicon oxide layer. The device isolation layer ST may fill trenches between the active patterns FN1 to FN8. At this time, a top surface of the device isolation layer ST may be higher than top surfaces of the active patterns FN1 to FN8.

The active patterns FN1 to FN8 may include first to eighth active patterns FN1 to FN8. Each of the active patterns FN1 to FN8 may extend in a second direction D2 and may be spaced apart from each other in a first direction D1. The first and second directions D1 and D2 may be parallel to a top surface of the substrate 100 and may intersect each other. Meanwhile, the second active pattern FN2 and the third active pattern FN3 may be spaced apart from each other in the second direction D2 with the device isolation layer ST interposed therebetween. In other words, the second and third active patterns FN2 and FN3 may be disposed between the first and fourth active patterns FN1 and FN4. The sixth active pattern FN6 and the seventh active pattern FN7 may be spaced apart from each other in the second direction D2 with the device isolation layer ST interposed therebetween. In other words, the sixth and seventh active patterns FN6 and FN7 may be disposed between the fifth and eighth active patterns FN5 and FN8.

Referring to FIGS. 5, 7A, and 7B, a first mask pattern 150 may be formed on the substrate 100. In more detail, a first mask layer may be formed on an entire top surface of the substrate 100, and the first mask layer may be patterned to form the first mask pattern 150 having an opening OP. The opening OP may expose the device isolation layer ST between the second and third active patterns FN2 and FN3. An upper portion of the device isolation layer ST between the second and third active patterns FN2 and FN3 may be etched when the opening OP is formed. Thus, a top surface of the device isolation layer ST between the second and third active patterns FN2 and FN3 may be lower than a top surface of the device isolation layer ST of another region.

Next, an insulating layer 103 may be formed in the opening OP. The insulating layer 103 may be formed on an entire top surface of the substrate 100, and the insulating layer 103 may be planarized or etched to remove portions of the insulating layer 103 disposed on a top surface of the first mask pattern 150. In other words, only the insulating layer 103 filling the opening OP may remain. A top surface of the remaining insulating layer 103 may be substantially coplanar with the top surface of the first mask pattern 150. The insulating layer 103 may include a silicon oxide layer and/or a silicon oxynitride layer.

Referring to FIGS. 5, 8A, and 8B, the first mask pattern 150 may be removed to expose the device isolation layer ST. Subsequently, the exposed device isolation layer ST may be recessed, so upper portions of the active patterns FN1 to FN8 may protrude from the device isolation layer ST. In other words, the active patterns FN1 to FN8 having fin shapes may be formed.

Meanwhile, the insulating layer 103 may be recessed along with the device isolation layer ST, and thus, an insulating pattern 105 may be formed between the second and third active patterns FN2 and FN3. At this time, a top surface of the insulating pattern 105 may be higher than the top surfaces of the active patterns FN1 to FN8. On the other hand, the device isolation layer ST under the insulating pattern 105 may be protected by the insulating pattern 105, so it may not be recessed. The second and third active patterns FN2 and FN3 may be relatively close to each other, and thus, interaction between the second and third active patterns FN2 and FN3 may be reduced or substantially prevented by the relatively high device isolation layer ST and the insulating pattern 105 therebetween.

Referring to FIGS. 9 and 10A to 10E, gate electrodes G1 to 06 may be formed on the substrate 100 to cross over the active patterns FN1 to FN8. The gate electrodes G1 to G6 may extend in the first direction D1. The gate electrodes G1 to G6 may include first to sixth gate electrodes G1 to G6 that are parallel to each other and cross over the active patterns FN1 to FN8. The gate electrodes G1 to G6 may be spaced apart from each other in the second direction D2.

A gate insulating pattern G1 may be formed between each of the gate electrodes G1 to G6 and the substrate 100. Gate spacers GS may be formed on opposite sidewalls of each of the gate electrodes G1 to G6. The gate insulating pattern G1 may also be disposed between each of the gate electrodes G1 to G6 and the gate spacers GS. Forming the gate electrodes G1 to G6, the gate insulating patterns G1, and the gate spacers GS may include forming sacrificial gate patterns (not shown) on the substrate 100, forming the gate spacers GS on opposite sidewalls of each of the sacrificial gate patterns, and replacing the sacrificial gate patterns with the gate insulating patterns G1 and the gate electrodes G1 to G6. The gate insulating patterns G1 may include at least one of a silicon oxide layer, a silicon oxynitride layer, or a high-k dielectric layer of which a dielectric constant is higher than that of a silicon oxide layer. The gate electrodes G1 to G6 may include at least one of a doped semiconductor material, a metal, or a conductive metal nitride. The gate spacers GS may include at least one of a silicon oxide layer, a silicon nitride layer, or a silicon oxynitride layer.

Ion implantation may be performed on the resultant structure having the gate electrodes G1 to G6 to form source/drain regions SD in upper portions of the active patterns FN1 to FN8. In detail, the source/drain regions SD may be formed in the first to eighth active patterns FN1 to FN8 at opposite sides of each of the gate electrodes G1 to G6, respectively. Upper portions of the active patterns FN1 to FN8, which are disposed under and overlap with the gate electrodes G1 to G6, may include channel regions AF. The source/drain regions SD are not formed in the channel regions AF.

In some embodiments, the second, third, fourth, and eighth active patterns FN2, FN3, FN4, and FN8 may define PMOSFET regions, and thus, the source/drain regions of the second, third, fourth, and eighth active patterns FN2, FN3, FN4, and FN8 may be formed by implanting P-type dopant ions. The first, fifth, sixth, and seventh active patterns FN1, FN5, FN6, and FN7 may define NMOSFET regions, and thus, the source/drain regions SD of the first, fifth, sixth, and seventh active patterns FN1, FN5, FN6, and FN7 may be formed by implanting N-type dopant ions.

Alternatively, the source/drain regions SD may be formed by another method. In other words, upper portions of the active patterns FN1 to FN8 disposed at opposite sides of each of the gate electrodes G1 to G6 may be removed to expose lower portions of the active patterns FN1 to FN8, and then, a selective epitaxial growth (SEG) process may be performed using the exposed lower portions of the active patterns FN1 to FN8 as seed layers to form the source/drain regions SD. The source/drain regions SD formed by the SEG process may be doped with dopants by ion implantation processes or in-situ methods. The source/drain regions SD may be doped with dopants having a different conductivity type from the active patterns FN1 to FN8. Unlike FIGS. 10A and 10B, top surfaces of the source/drain regions SD may have a non-zero curvature (i.e., are not flat). For example, the source/drain regions SD may have top surfaces that are convex upward.

Subsequently, a first interlayer insulating layer 110 may be formed to cover the source/drain regions SD and to fill spaces between the gate electrodes G1 to G6. A capping layer GP may be formed on the first interlayer insulating layer 110 to cover top surfaces of the gate electrodes G1 to G6. The capping layer GP may include at least one of a silicon oxide layer, a silicon nitride layer, or a silicon oxynitride layer. A second interlayer insulating layer 115 may be formed on the capping layer GP. Each of the first and second interlayer insulating layers 10 and 115 may include at least one of a silicon oxide layer or a silicon oxynitride layer.

Referring to FIGS. 11 and 12A to 12E, first sub-contacts SC1 connected to the source/drain regions SD may be formed in the first and second interlayer insulating layers 110 and 115 and the capping layer GP. Forming the first sub-contacts SC1 may include forming first sub-contact holes SH1 penetrating the first and second interlayer insulating layers 110 and 115 and the capping layer GP to expose the source/drain regions SD at opposite sides of each of the gate electrodes G1 to G6, sequentially forming a barrier layer BL and a conductive material that fill the first sub-contact holes SH1, and planarizing the conductive material and the barrier layer BL until the second interlayer insulating layer 115 is exposed. The first sub-contacts SC1 may include a metal silicide. For example, the first sub-contacts SC1 may include at least one of titanium silicide, tantalum silicide, or tungsten silicide. The barrier layer BL may include Ti/TiN.

The first sub-contacts SC1 may have bar shapes extending in the first direction D1 between the gate electrodes G1 to G6 when viewed from a plan view. In some embodiments, the first sub-contact SC1 between the third and fourth gate electrodes G3 and G4 may electrically connect the source/drain regions SD of the third and fourth active patterns FN3 and FN4, which are spaced apart from each other in the first direction D1, to each other. Top surfaces of the first sub-contacts SC1 may be higher than top surfaces of the gate electrodes G1 to G6.

Although not shown in the drawings, connection conductive patterns (not shown) may be formed together with the first sub-contacts SC1. The connection conductive patterns may be electrically connected to some of the source/drain regions SD. Thus, source/drain contacts SDC to be described later may be electrically connected to some of the source/drain regions SD through the connection conductive patterns.

Figure 11:
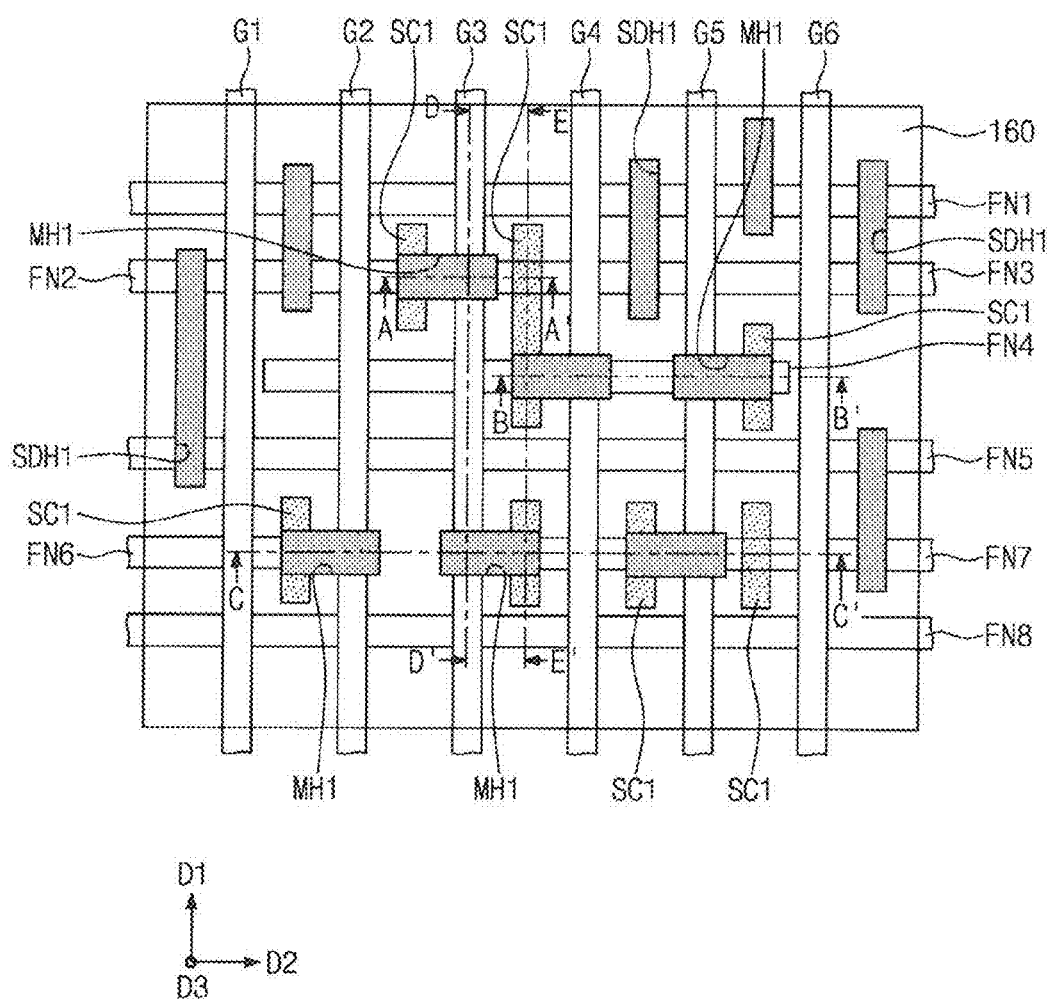
Figure 12A:
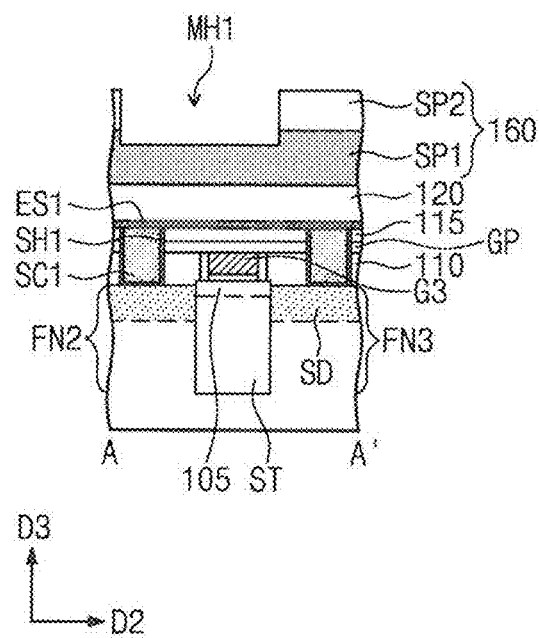
Figure 12B:
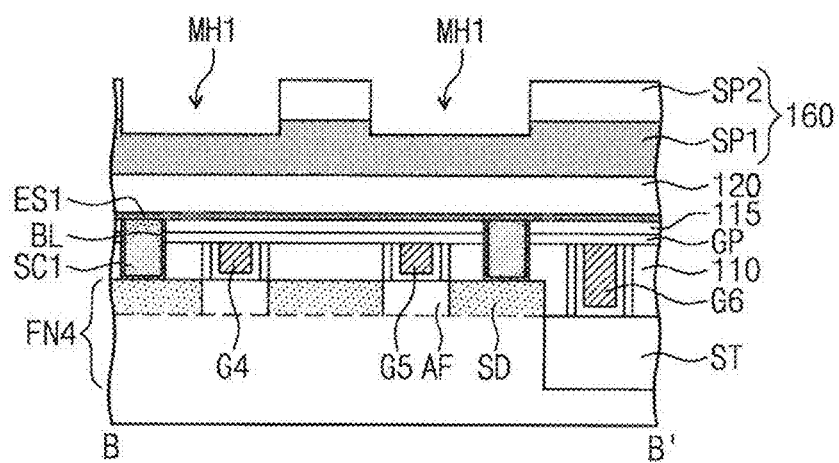
Figure 12C:
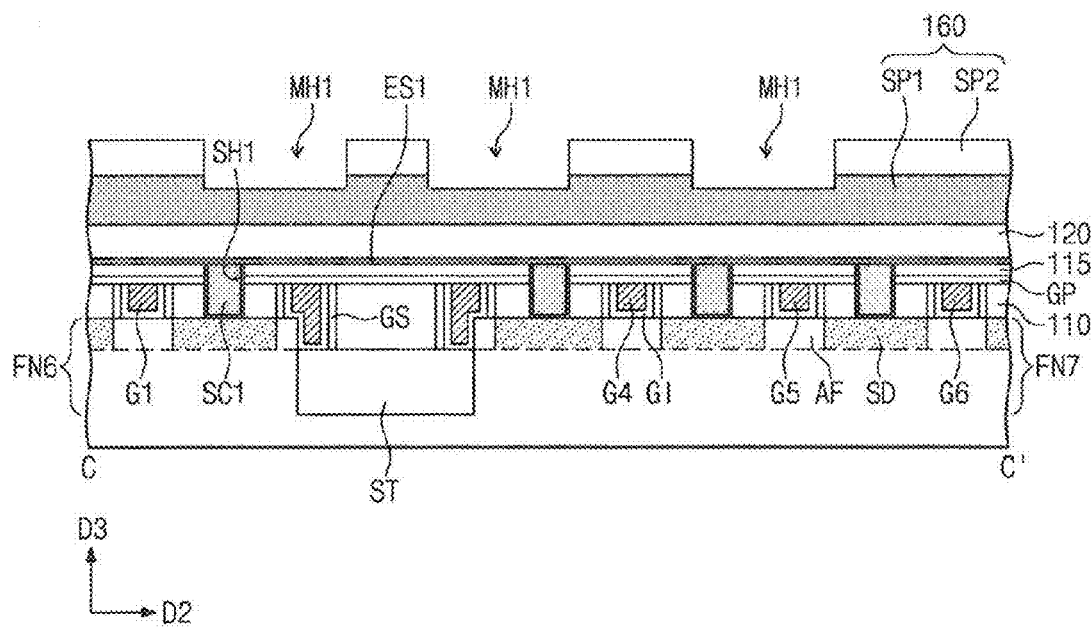
Figure 12D:
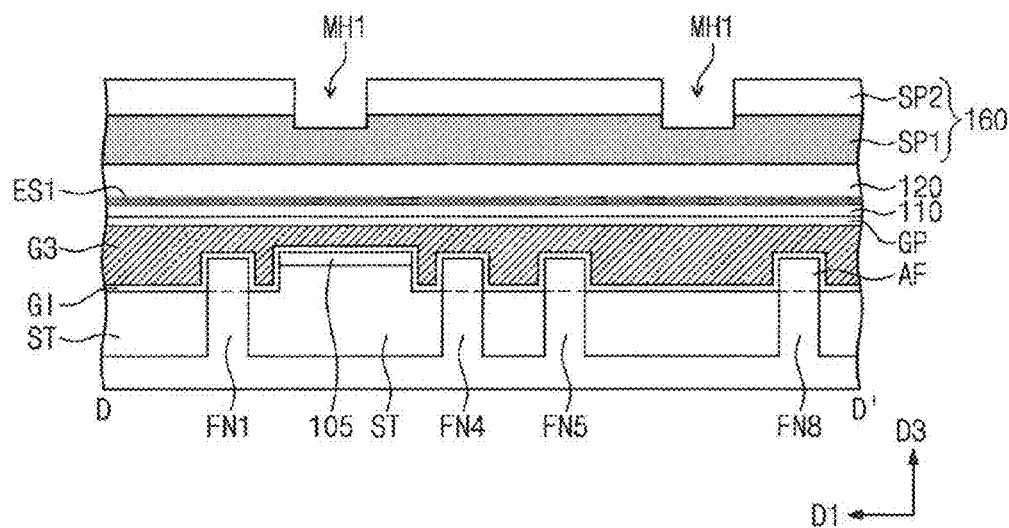
Figure 12E:
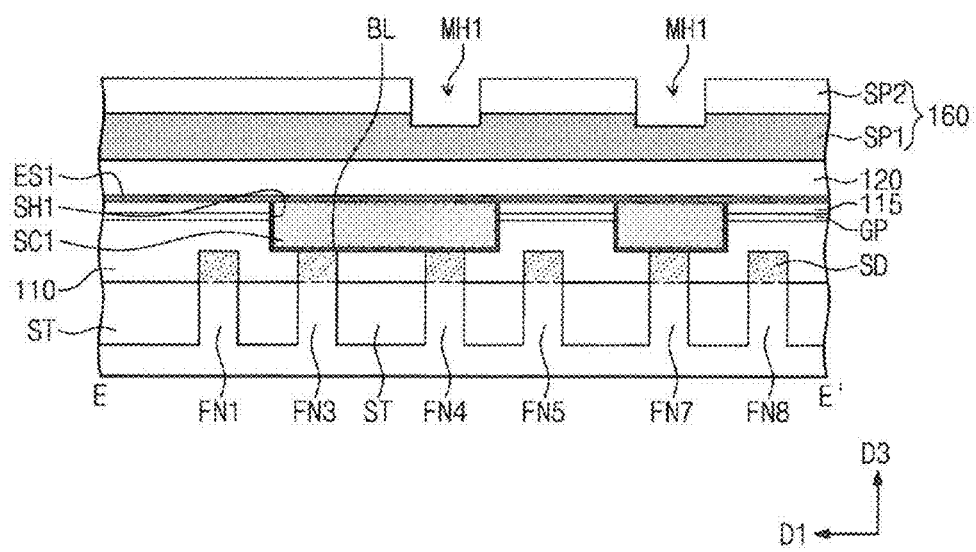
Figure 13:
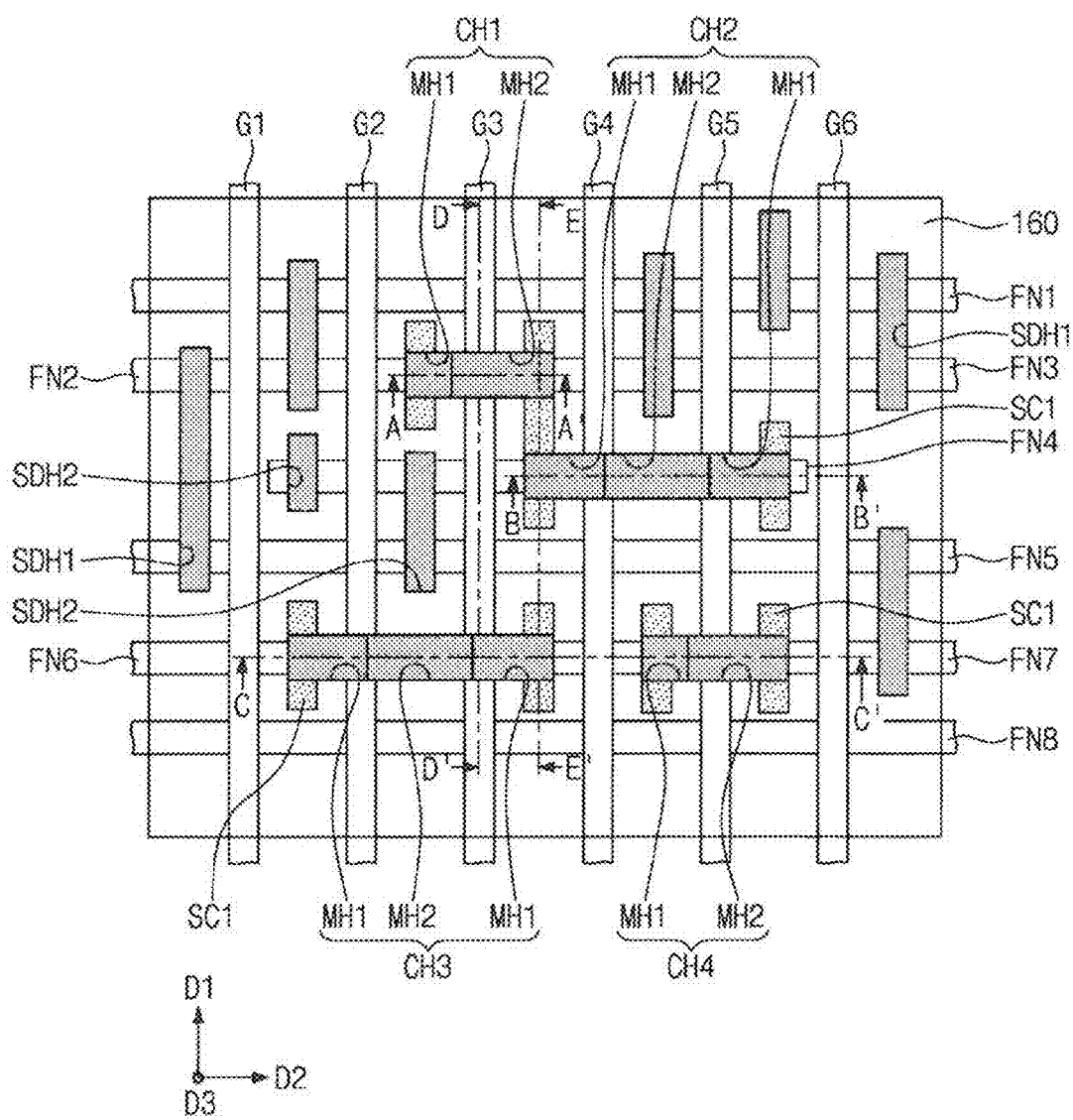
Figure 14A:
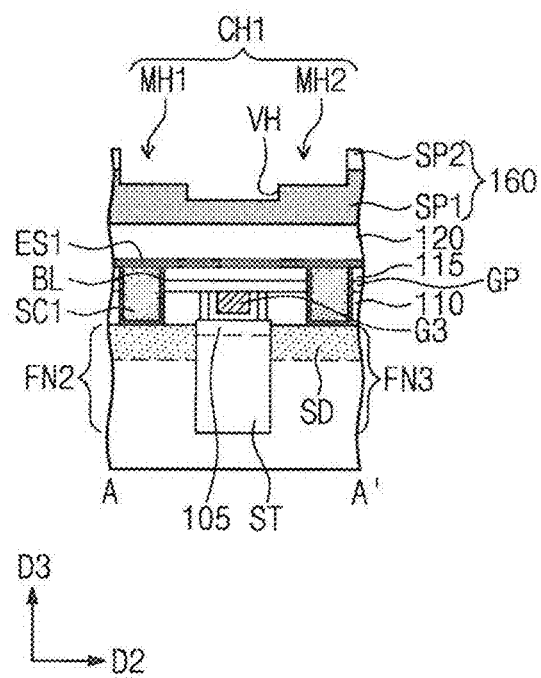
Figure 14B:
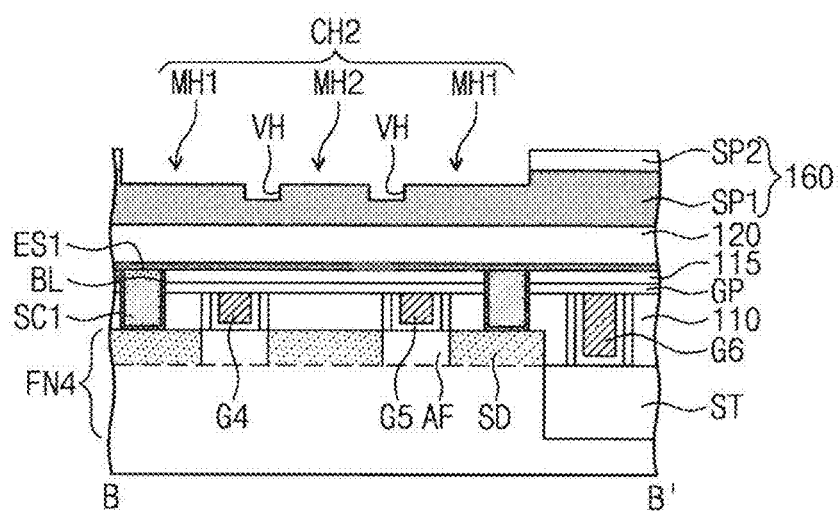
Figure 14C:
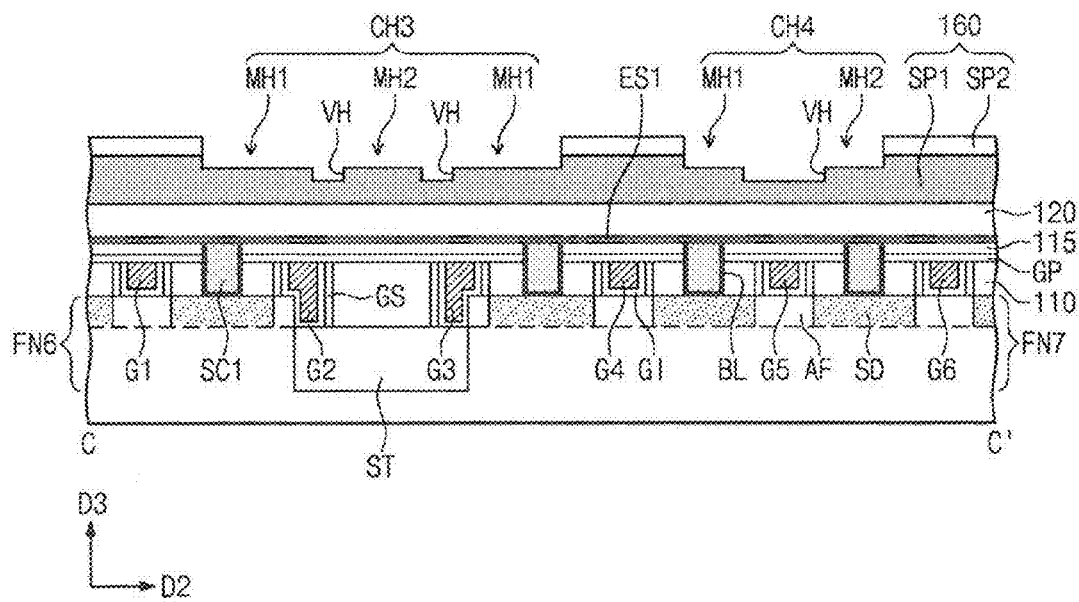
Figure 14D:
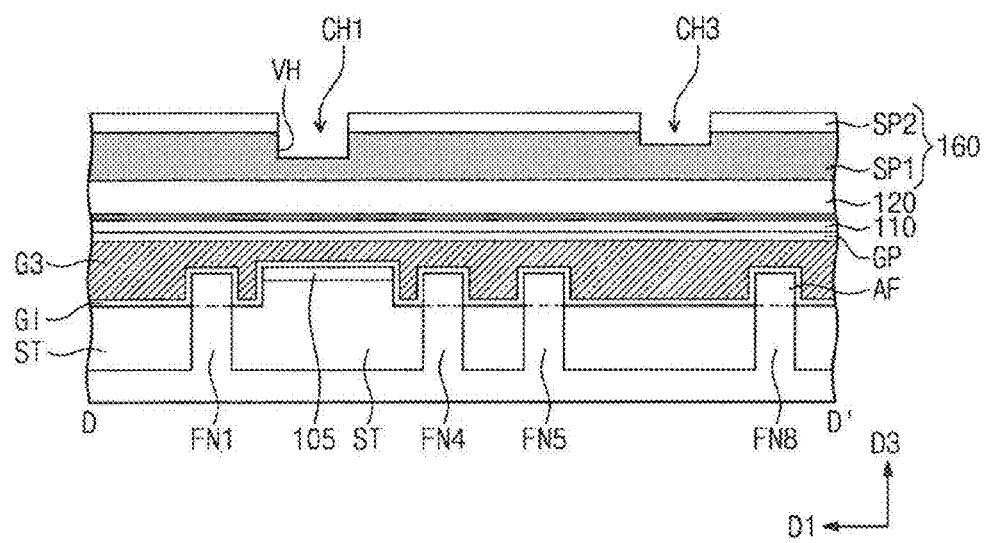
Figure 14E:
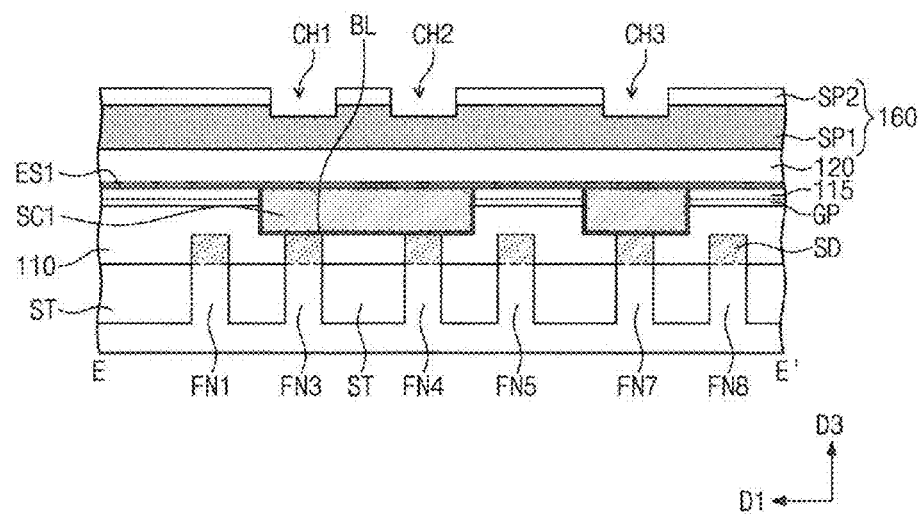
Figure 15:
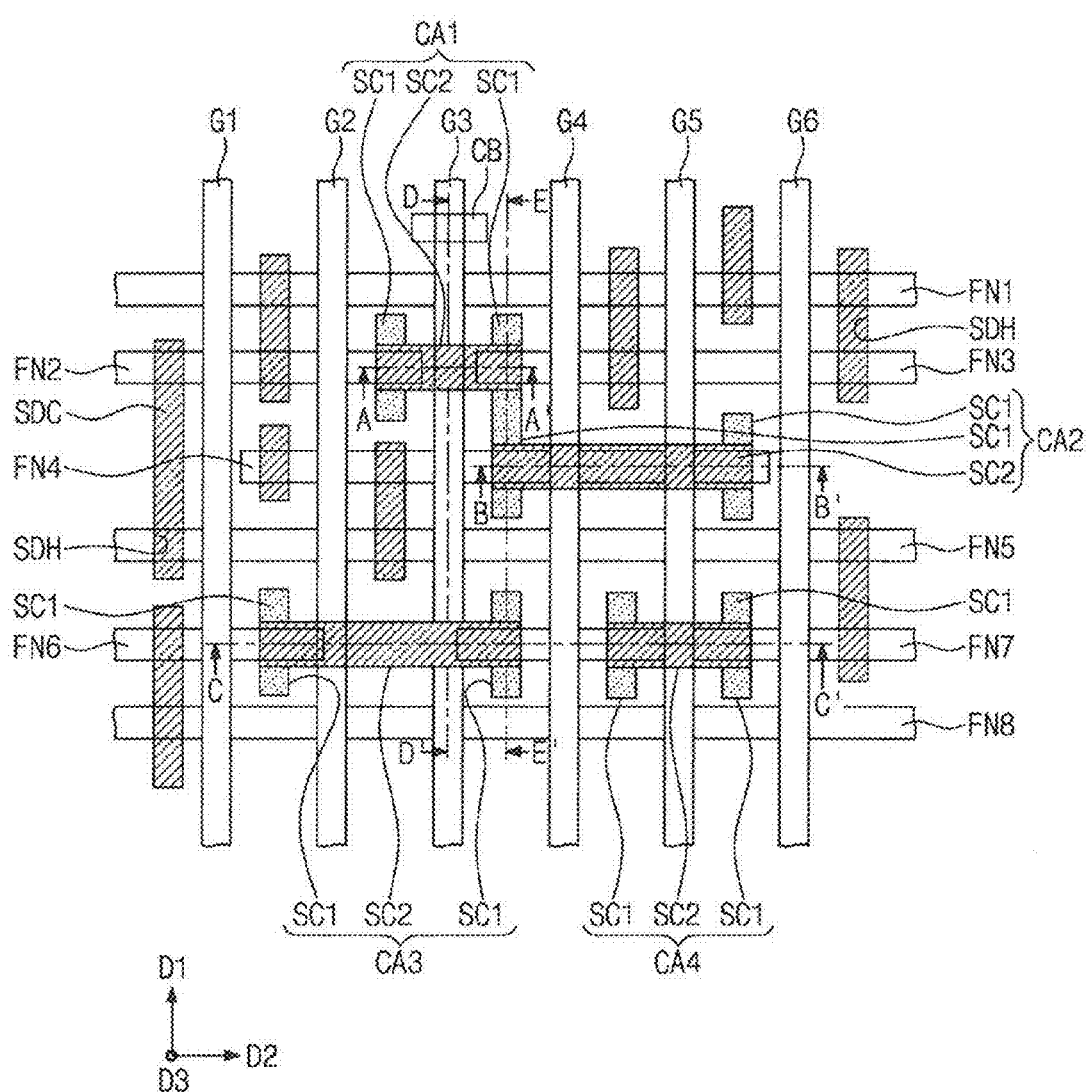

A first etch stop layer ES1, a third interlayer insulating layer 120, and a second mask pattern 160 may be sequentially formed on the resultant structure having the first sub-contacts SC1. The first etch stop layer ES1 may include silicon carbonitride (SiCN), and the third interlayer insulating layer 120 may include a silicon oxide layer or a silicon oxynitride layer. The first etch stop layer ES1 may act as a barrier to substantially prevent a metal of the first sub-contacts SC1 from diffusing through exposed top surfaces of the first sub-contacts SC1. The second mask pattern 160 may include a first sub-mask pattern SP1 and a second sub-mask pattern SP2 which are sequentially stacked. The second mask pattern 160 may define first mask holes MH1 and first source/drain contact holes SDH1 (FIG. 11). Each of the first mask holes MH1 may vertically overlap with one of the first sub-contacts SC1.

In more detail, a first sub-mask layer and a second sub-mask layer may be sequentially formed on the third interlayer insulating layer 120. The second sub-mask layer may have an etch selectivity with respect to the first sub-mask layer. The second and first sub-mask layers may be patterned using a first photo mask (not shown) to form the first and second sub-mask patterns SP1 and SP2. The first and second sub-mask patterns SP1 and SP2 may define the first mask holes MH1 and the first source/drain contact holes SDH1. In other words, the first mask holes MH1 and the first source/drain contact holes SDH1 may be formed by means of a first photolithography process using a first layout defining their positions. Here, the first mask holes MH1 and the first source/drain contact holes SDH1 illustrated in FIG. 11 may correspond to the first mask layout. When the first mask holes MH1 are formed, only an upper portion of the first sub-mask layer may be recessed.

Referring to FIGS. 13 and 14A to 14E, the second mask pattern 160 may be patterned again to form second mask holes MH2 and second source/drain contact holes SDH2. In more detail, a second photo mask (not shown) may be formed on the second mask pattern 160, and then, the first and second sub-mask patterns SP1 and SP2 may be patterned using the second photo mask. Thus, the first and second sub-mask patterns SP1 and SP2 may define the second mask holes MH2 and the second source/drain contact holes SDH2 as well as the first mask holes MH1 and the first source/drain contact holes SDH1. In other words, the second mask holes MH2 and the second source/drain SDH2 may be formed by means of a second photolithography process using a second layout defining their positions. Here, the second mask holes MH2 and the second source/drain contact holes SDH2 illustrated in FIG. 13 may correspond to the second mask layout. When the second mask holes MH2 are formed, only the upper portion of the first sub-mask layer may be recessed.

The second source/drain contact holes SDH2 may be formed to be adjacent to the first source/drain contact holes SDH1. The second mask holes MH2 may be formed to be adjacent to the first mask holes MH1. In particular, the second mask holes MH2 may partially overlap with the first mask holes MH1. In other words, the second layout defining the second mask holes MH2 may partially overlap with the first layout defining the first mask holes MH1. Vertical extension holes VH may be formed in overlapping regions of the first mask holes MH1 and the second mask holes MH2.

In more detail, portions of the first mask holes MH1 may be exposed through the second photo mask. The exposed portions of the first mask holes MH1 may be superimposed on the overlapping regions of the first and second layouts, which are described above. The exposed portions of the first mask holes MH1 may be etched again during an etching process using the second photo mask (double etching). As a result, the overlapping regions of the second mask holes MH2 and the first mask holes MH1 may be over-etched to form the vertical extension holes VH in the second mask pattern 160. Each of the vertical extension holes VH may vertically extend from a portion of a bottom surface of the first mask hole MH1 toward the substrate 100. However, the vertical extension holes VH may not completely penetrate the second mask pattern 160.

The first and second mask holes MH1 and MH2 overlapping with each other may be connected to each other to constitute one communicating hole. In the present embodiment, first, second, third, and fourth communicating holes CH1, CH2, CH3, and CH4 are illustrated as an example. However, the inventive concepts are not limited thereto. Finally, the first to fourth communicating holes CH1 to CH4 and the first and second source/drain contact holes SDH1 and SDH2 may be defined using the first and second photolithography processes in the second mask pattern 160.

According to the present embodiment, the first to fourth communicating holes CH1 to CH4 may be formed by means of the first and second photolithography processes using the first and second mask layouts that are different from each other. Thus, the first to fourth communicating holes CH1 to CH4 may be formed to be precisely vertically aligned with the first sub-contacts SC1 in a highly integrated semiconductor device. In addition, when holes spaced apart from each other with a fine pitch (e.g., between the first and second communicating holes CH1 and CH2) are formed, the adjacent holes may be formed using the different layouts to improve a process margin. Furthermore, holes intersecting a plurality of gate electrodes (e.g., the second and third communicating holes CH3 and CH4) may also be precisely formed.

Referring to FIGS. 15, 16A to 16E, the third interlayer insulating layer 120 and the first etch stop layer ES1 may be successively patterned using the second mask pattern 120 as an etch mask to form second sub-contact holes SH2 and source/drain contact holes SDH. Next, a remaining portion of the second mask pattern 160 may be removed. The second sub-contact holes SH2 may be superimposed on the first to fourth communicating holes CH1 to CH4, and the source/drain contact holes SDH may be superimposed on the first and second source/drain contact holes SDH1 and SDH2 of the second mask pattern 160. In particular, an etching process for the formation of the second sub-contact holes SH2 may be performed until top surfaces of the first sub-contacts SC1 are exposed. If the connection conductive patterns (not shown) are formed, the etching process for the formation of the source/drain contact holes SDH and the second sub-contact holes SH2 may be performed until top surfaces of the connection conductive patterns and the top surfaces of the first sub-contacts SC1 are exposed.

In more detail, the first sub-mask pattern SP1 may be further etched using the second sub-mask pattern SP2 as an etch mask, so a top surface of the third interlayer insulating layer 120 may be exposed through the first to fourth communicating holes CH1 to CH4.

Next, the third interlayer insulating layer 120 may be etched using the first sub-mask pattern SP1 as an etch mask to form the second sub-contact holes SH2. In other embodiments, although not shown in the drawings, a third sub-mask layer (not shown) may be additionally formed between the first sub-mask pattern SP1 and the third interlayer insulating layer 120. The third sub-mask layer may include a material having an etch selectivity with respect to both the first sub-mask pattern SP1 and the third interlayer insulating layer 120. Thus, the third sub-mask layer and the third interlayer insulating layer 120 may be sequentially etched using the first sub-mask pattern SP1 as an etch mask to form the second sub-contact holes SH2.

Figure 16A:
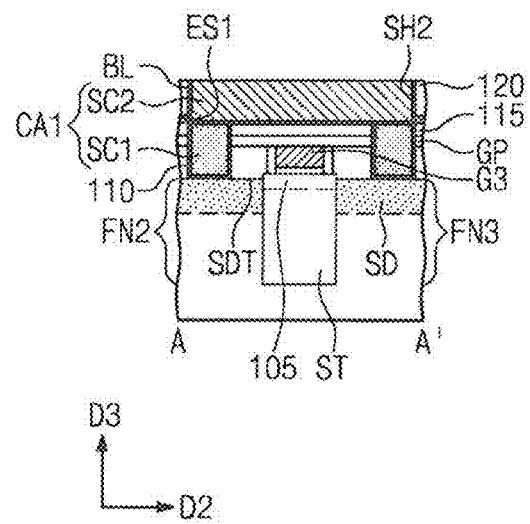
Figure 16B:
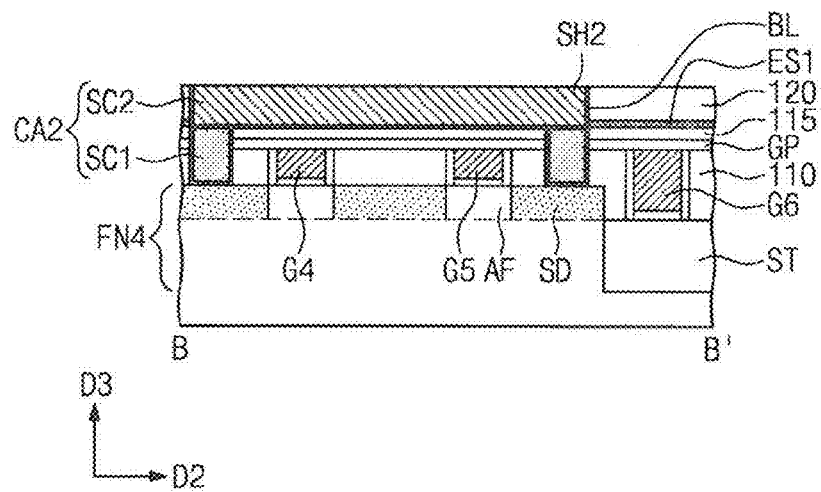
Figure 16C:
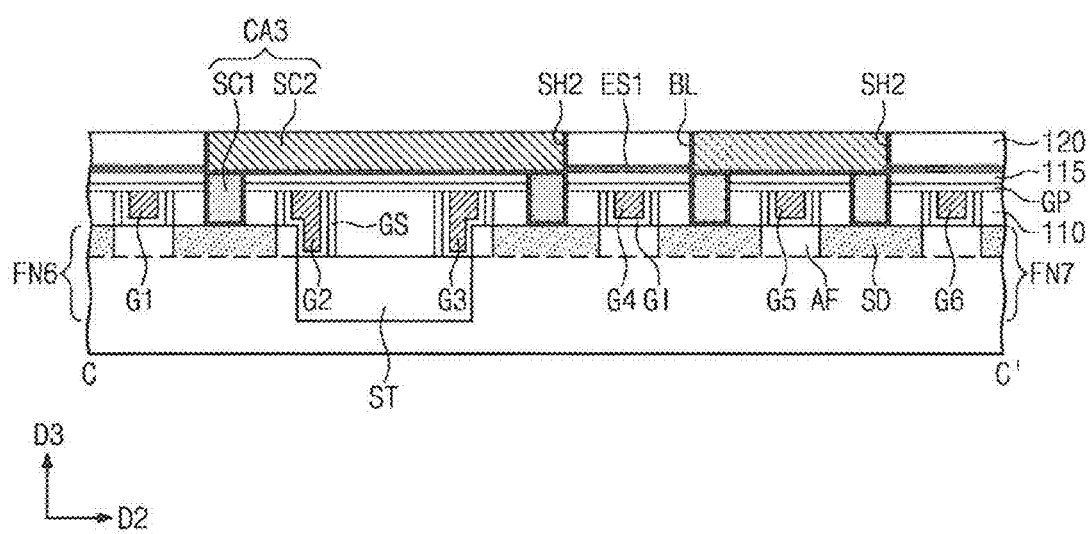
Figure 16D:
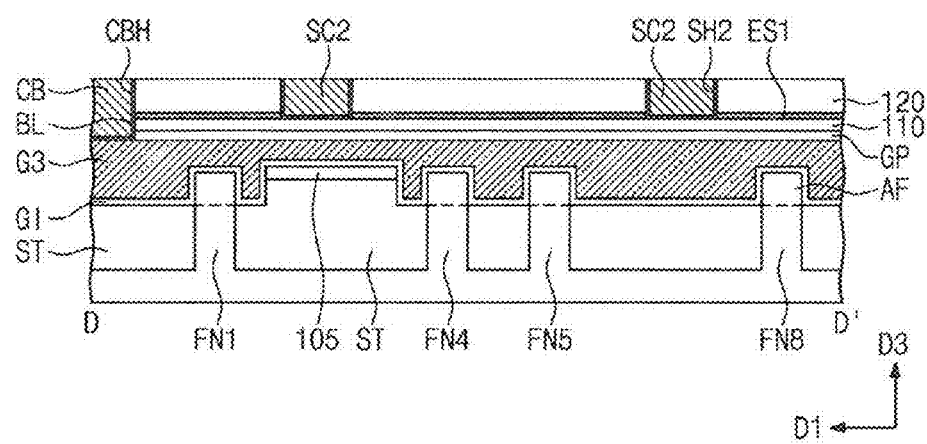
Figure 16E:
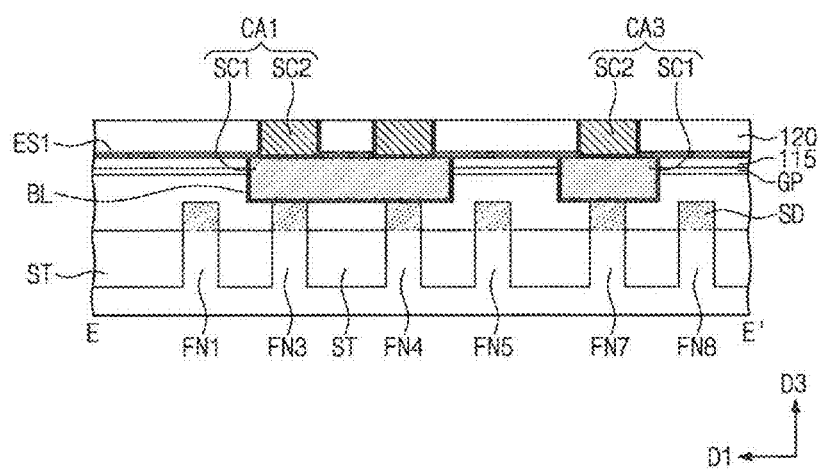

In addition, a gate contact hole CBH penetrating the third interlayer insulating layer 120 may be formed using an additional mask layer, as illustrated in FIG. 16D. The gate contact hole CBH may penetrate the first to third interlayer insulating layers 110, 115, and 120 to expose a portion of the top surface of the third gate electrode G3. In other words, an etching process for the formation of the gate contact hole CBH may be performed until a portion of the capping layer GP on the third gate electrode G3 is completely removed.

Subsequently, second sub-contacts SC2, source/drain contacts SDC, and a gate contact CB may be formed to fill the second sub-contact holes SH2, the source/drain contact holes SDH, and the gate contact hole CBH, respectively. Forming the second sub-contacts SC2 may include sequentially forming a barrier layer BL and a conductive material filling the second sub-contact holes SH2, and planarizing the conductive material and the barrier layer BL until the third interlayer insulating layer 120 is exposed. The barrier layer BL and the conductive material may be sequentially stacked on the first sub-contacts SC1, and thus, the barrier layer BL may be disposed between the second sub-contacts SC2 and the first sub-contacts SC1. The second sub-contacts SC2 may include at least one of a doped semiconductor material, a metal, or a conductive metal nitride. Here, the second sub-contacts SC2 may include a different material from the first sub-contacts SC1. The barrier layer BL may include Ti/TiN. Thus, the barrier layer BL may substantially prevent a metal from being diffused between the first sub-contacts SC1 and the second sub-contacts SC2.

The first and second sub-contacts SC1 and SC2 may constitute first to fourth active contacts CA to CA4. The first active contact CA1 may be formed on the second and third active patterns FN2 and FN3 to cross over the third gate electrode G3, and the second active contact CA2 may be formed on the fourth active pattern FN4 to cross over the fourth and fifth gate electrodes G4 and G5. The third active contact CA3 may be formed on the sixth and seventh active patterns FN6 and FN7 to cross over the second and third gate electrodes G2 and G3, and the fourth active contact CA4 may be formed on the seventh active pattern FN7 to cross over the fifth gate electrode GS.

A method of forming the source/drain contacts SDC and the gate contact CB may be similar to the method of the forming the second sub-contacts SC2.

Referring again to FIGS. 2 and 3A to 3E, a fourth interlayer insulating layer 130 and a fifth interlayer insulating layer 140 may be sequentially formed on the third interlayer insulating layer 120 to cover the first to fourth active contacts CA1 to CA4, the source/drain contacts SDC, and the gate contact CB. First to fourth vias V1 to V4 may be formed to penetrate the fourth interlayer insulating layer 130, and first to fourth conductive lines CBL1 to CBL4 may be formed in the fifth interlayer insulating layer 140.

The first via V1 may be formed on the gate contact CB. The first conductive line CBL1 may be electrically connected to the third gate electrode G3 through the first via V1. The second via V2 may be formed on the source/drain contact SDC between the fifth and sixth gate electrodes G5 and G6, and the third via V3 may be formed on the source/drain contact SDC adjacent to the first gate electrode G1. The second and third conductive lines CBL2 and CBL3 may be electrically connected to the source/drain regions SD through the second and third vias V2 and V3, respectively. The fourth via V4 may be formed on the fourth active contact CA4. The fourth conductive line CBL4 may be electrically connected to a pair of the source/drain regions SD through the fourth via V4.

[Applications]

Figure 17:
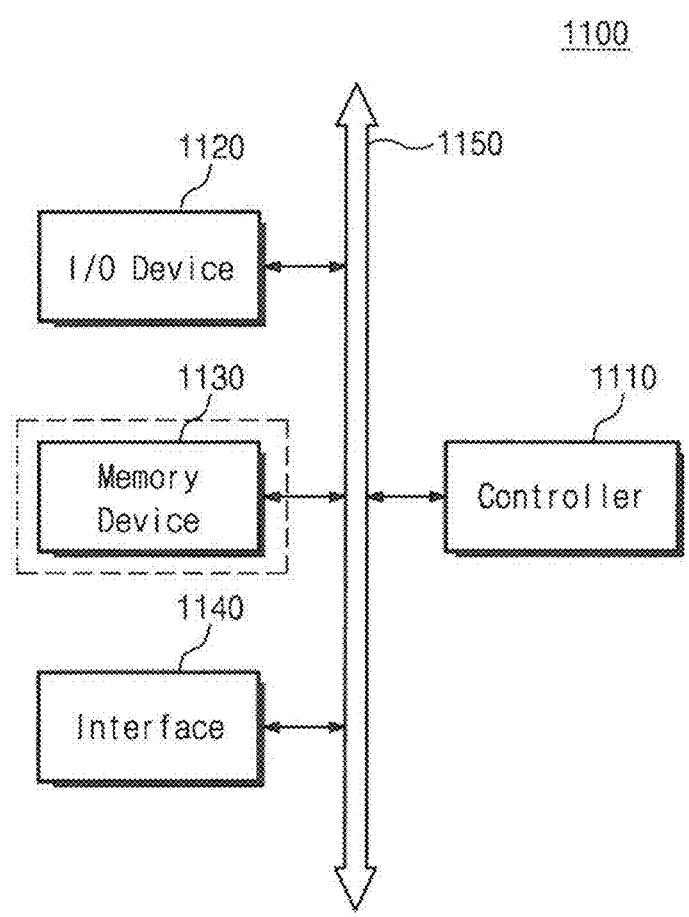
FIG. 17 is a schematic block diagram illustrating an electronic system including a semiconductor device according to example embodiments of the inventive concepts.

FIG. 17 is a schematic block diagram illustrating an electronic system including a semiconductor device according to example embodiments of the inventive concepts.

Referring to FIG. 17, an electronic system 1100 according to an embodiment of the inventive concept may include a controller 1110, an input/output (I/O) device 1120, a memory device 1130, an interface unit 1140, and a data bus 1150. At least two of the controller 1110, the I/O device 1120, the memory device 1130, and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or other logic devices having a similar function to any one thereof. The I/O device 1120 may include a keypad, a keyboard and/or a display device. The memory device 1130 may store data and/or commands. The memory device 1130 may include a non-volatile memory device (e.g., a flash memory device, a phase change memory device, and/or a magnetic memory device). In addition, the memory device 1130 may further include a volatile memory device. In this case, the memory device 1130 may include a SRAM device including the semiconductor device according to embodiments of the inventive concepts. The memory device 1130 may be omitted according to application of the electronic system 1100 or an electronic product implemented with the electronic system 1100. The interface unit 1140 may transmit electrical data to a communication network or may receive electrical data from a communication network. The interface unit 1140 may operate by wireless or cable. For example, the interface unit 1140 may include an antenna or a wireless/cable transceiver. The semiconductor device according to the aforementioned embodiments of the inventive concepts may be applied to the controller 1110 or a portion of the I/O device 1120. Although not shown in the drawings, the electronic system 1100 may further include a fast dynamic random access memory (DRAM) device and/or a fast SRAM device which acts as a cache memory for improving an operation of the controller 1110.

Figure 18:
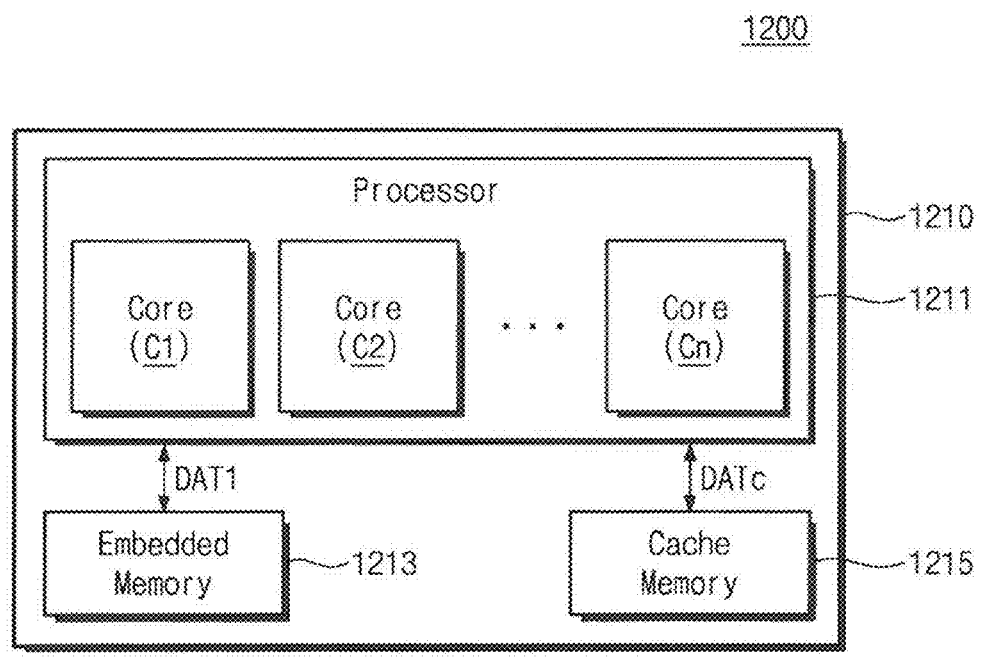
FIG. 18 is a schematic block diagram illustrating an electronic device including a semiconductor device according to example embodiments of the inventive concepts.

FIG. 18 is a schematic block diagram illustrating an electronic device including a semiconductor device according to example embodiments of the inventive concepts.

Referring to FIG. 18, an electronic device 1200 may include a semiconductor chip 1210. The semiconductor device 1210 may include a processor 1211, an embedded memory 1213, and a cache memory 1215.

The processor 1211 may include one or more processor cores C1 to Cn. The one or more process cores C1 to Cn may process electrical data and electrical signals. The processor cores C1 to Cn may include a plurality of logic cells. In some embodiments, the logic cells may include the semiconductor device according to the above mentioned embodiments of the inventive concepts.

The electronic device 1200 may perform a specific function using the processed data and signals. For example, the processor 1211 may be an application processor.

The embedded memory 1213 may exchange first data DAT1 with the processor 1211. The first data DAT1 may be data processed or to be processed by the one or more processor cores C1 to Cn. The embedded memory 1213 may manage the first data DAT1. For example, the embedded memory 1213 may buffer the first data DAT1. In other words, the embedded memory 1213 may act as a buffer memory or a working memory of the processor 1211.

In some embodiments, the electronic device 1200 may be applied to a wearable electronic device. The wearable electronic device may mainly perform functions requiring a relatively small quantity of operations. Thus, when the electronic device 1200 is applied to the wearable electronic device, the embedded memory 1213 may not have a great buffer capacity.

The embedded memory 1213 may be a SRAM. An operating speed of the SRAM may be faster than that of a DRAM. When the SRAM is embedded in the semiconductor chip 1210, it is possible to realize the electronic device 1200 having a small size and a fast operating speed. In addition, when the SRAM is embedded in the semiconductor chip 1210, consumption of an active power of the electronic device 1200 may be reduced. In some embodiments, the SRAM may include the semiconductor device according to the above mentioned embodiments of the inventive concepts.

The cache memory 1215 may be mounted on the semiconductor chip 1210 along with the one or more process cores C1 to Cn. The cache memory 1215 may store cache data DATc. The cache data DATc may be data used by the one or more process cores C1 to Cn. The cache memory 1215 may have a relatively small capacity but may have a very fast operating speed. For example, the cache memory 1215 may include a SRAM including the semiconductor device according to the above mentioned embodiments of the inventive concepts. When the cache memory 1215 is used, it is possible to reduce an accessing number and an accessing time of the processor 1211 with respect to the embedded memory 1213. Thus, the operating speed of the electronic device 1200 may be improved when the cache memory 1215 is used.

In FIG. 18, the cache memory 1215 is distinguished from the processor 1211 for the purpose of case and convenience in explanation. However, in other embodiments, the cache memory 1215 may be configured to be included in the processor 1211. In other words, embodiments of the inventive concepts are not limited to the embodiment illustrated in FIG. 18.

The processor 1211, the embedded memory 1213, and the cache memory 1215 may transmit electrical data on the basis of at least one of various interface protocols. For example, the processor 1211, the embedded memory 1213, and the cache memory 1215 may transmit electrical data on the basis of at least one interface protocol of universal serial bus (USB), small computer system interface (SCSI), peripheral component interconnect (PCI) express, advanced technology attachment (ATA), parallel ATA (PATA), serial ATA (SATA), serial attached SCSI (SAS), integrated drive electronics (IDE), or universal flash storage (UFS).

Figure 19:
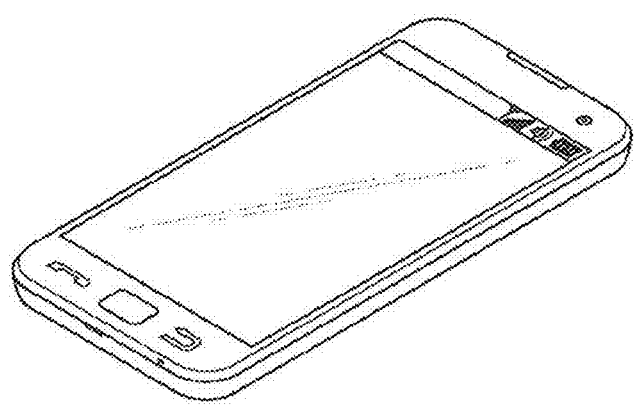
FIGS. 19 to 21 illustrate embodiments of multimedia devices including semiconductor devices according to example embodiments of the inventive concepts.
Figure 20:
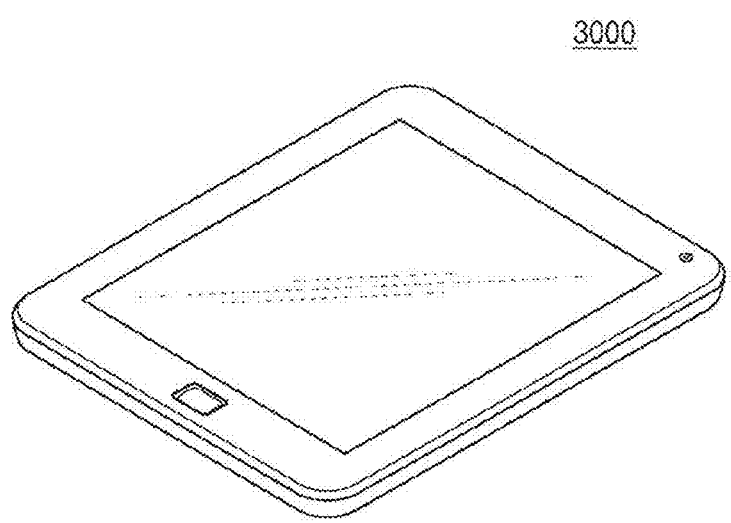
Figure 21:
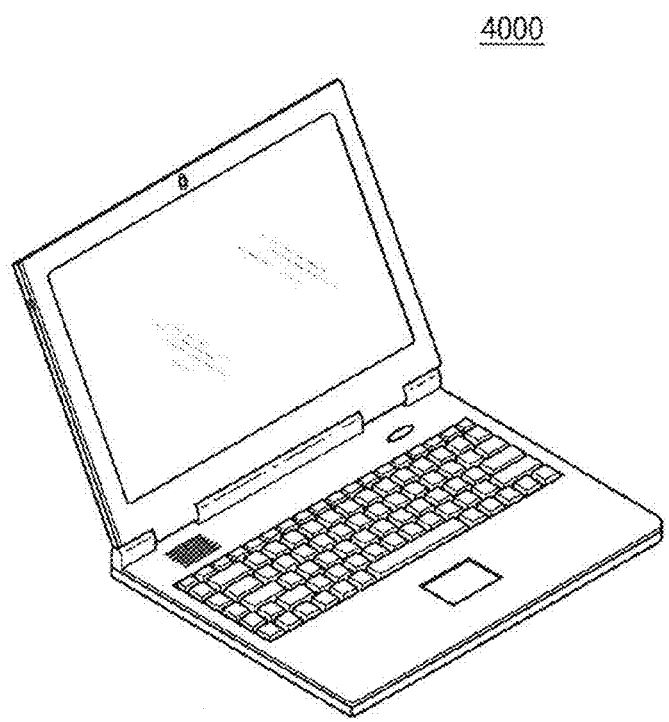

FIGS. 19 to 21 illustrate embodiments of multimedia devices including semiconductor devices according to the aforementioned embodiments of the inventive concepts. The electronic system 1100 of FIG. 17 and/or the electronic device 1200 of FIG. 18 may be applied to a mobile or smart phone 2000 illustrated in FIG. 19, a tablet or smart table 3000 illustrated in FIG. 20, and/or a notebook computer 4000 illustrated in FIG. 21.

According to embodiments of the inventive concepts, the semiconductor device may include the active contact which crosses over the gate electrode and electrically connects a pair of source/drain regions to each other. As a result, the degree of freedom of a circuit design may be improved using the active contact. In addition, since the active contact is formed using the patterning processes different from each other, misalignment of the active contact may be minimized or substantially prevented. In other words, the active contact may be easily formed using the different patterning processes.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
    a substrate including an active pattern thereon, the active pattern extending in a first direction parallel to a top surface of the substrate and including first and second source/drain regions;
    a gate electrode that crosses over the active pattern between the first and second source/drain regions and extends in a second direction intersecting the first direction; and
    an active contact that electrically connects the first and second source/drain regions to each other,
    wherein the active contact is spaced apart from the gate electrode, and
    wherein the active contact comprises:
    first sub-contacts on the first and second source/drain regions and electrically connected to the first and second source/drain regions, respectively;
    a second sub-contact on the first sub-contacts and crossing over the gate electrode to electrically connect the first sub-contacts to each other; and
    a barrier layer between the second sub-contact and each of the first sub-contacts,
    wherein the first and second source/drain regions are disposed on respective opposite sides of the gate electrode,
    wherein the active pattern includes a channel region between the first and second source/drain regions, and
    wherein the channel region vertically overlaps with the gate electrode.

2. The semiconductor device of claim 1, wherein the active pattern includes a first active pattern and a second active pattern that are spaced apart from each other with the gate electrode interposed therebetween,
    wherein the first and second active patterns include the first and second source/drain regions, respectively, and wherein the gate electrode extends in the second direction on a device isolation layer between the first and second active patterns.

3. The semiconductor device of claim 2, further comprising:
an insulating pattern between the gate electrode and the device isolation layer,
wherein a bottom surface of a portion of the gate electrode disposed on the insulating pattern is higher than top surfaces of the first and second active patterns.

4. The semiconductor device of claim 1, wherein the gate electrode includes a plurality of gate electrodes on the substrate between the first and second source/drain regions, and
wherein the second sub-contact crosses over the plurality of gate electrodes when viewed from a plan view.

5. The semiconductor device of claim 1, wherein the gate electrode includes a plurality of gate electrodes intersecting the substrate between the first and second source/drain regions, the semiconductor device further comprising:
a capping layer covering top surfaces of the plurality of gate electrodes,
wherein the first sub-contacts penetrate the capping layer so as to be connected to the first and second source/drain regions, respectively.

6. The semiconductor device of claim 1, wherein a bottom surface of the second sub-contact is higher than a top surface of the gate electrode.

7. The semiconductor device of claim 1, wherein the first sub-contacts and the second sub-contact include conductive materials that are different from each other, and
wherein the barrier layer inhibits a material from diffusing between the second sub-contact and the first sub-contacts.

8. The semiconductor device of claim 1, further comprising:
a via on the active contact; and
a conductive line on the via and being electrically connected to the first and second source/drain regions through the via and the active contact.

9. The semiconductor device of claim 1, wherein the active contact has one sidewall adjacent to the first source/drain region or the second source/drain region when viewed from a cross-sectional view taken along a specific direction, and
wherein the one sidewall has a stepped profile.

10. A semiconductor device comprising:
a substrate including first and second active fin patterns formed thereon, the first and second active fin patterns including first and second source/drain regions, respectively;
a device isolation layer on the substrate segmenting a fin structure into the first and second active fin patterns;
a gate electrode crossing over the device isolation layer between the first and second active fin patterns; and
an active contact electrically connecting the first and second source/drain regions to each other,
wherein the active contact is spaced apart vertically from the gate electrode,
wherein the active contact comprises:
first sub-contacts connected to the first and second source/drain regions; and
a second sub-contact electrically connecting the first sub-contacts to each other,
wherein the second sub-contact crosses over the device isolation layer and the gate electrode.

11. The semiconductor device of claim 10, wherein the first and second active fin patterns extend in a first direction parallel to a top surface of the substrate and are spaced apart from each other in the first direction, and
wherein the gate electrode extends in a second direction that intersects the first direction.

12. The semiconductor device of claim 10, wherein a bottom surface of a portion of the gate electrode disposed on the device isolation layer is higher than top surfaces of the first and second active fin patterns.

13. The semiconductor device of claim 10, wherein the gate electrode includes a plurality of gate electrodes intersecting the substrate between the first and second active fin patterns, and
wherein the second sub-contact crosses over the plurality of gate electrodes when viewed from a plan view.

14. The semiconductor device of claim 13, further comprising:
a capping layer on top surfaces of the plurality of gate electrodes,
wherein the first sub-contacts penetrate the capping layer so as to be connected to the first and second source/drain regions, respectively.

15. The semiconductor device of claim 10, wherein upper portions of the first and second active fin patterns vertically protrudes with respect to a top surface of the device isolation layer.

16. A semiconductor device comprising:
a substrate including a first active pattern extending in a first direction, the first active pattern having first and second source/drain regions and a channel region between the first and second source/drain regions;
a gate electrode crossing the first active pattern in a second direction intersecting the first direction; and
an active contact that electrically connects the first and second source/drain regions to each other,
wherein the active contact is spaced apart from the gate electrode,
wherein a portion of the gate electrode on the first active pattern vertically overlaps with the channel region, and
wherein the active contact comprises:
first sub-contacts on the first and second source/drain regions, respectively; and
a second sub-contact on the first sub-contacts and crossing over the gate electrode in the first direction to electrically connect the first sub-contacts to each other.

17. The semiconductor device of claim 16, wherein the substrate further includes a second active pattern extending in the first direction and having a third source/drain region,
wherein the second active pattern is spaced apart from the first active pattern in the second direction,
wherein the first sub-contact on the first source/drain region extends in the second direction to electrically connect the first source/drain region to the third source/drain region.

18. The semiconductor device of claim 16 wherein the active contact further comprises a barrier layer between the second sub-contact and each of the first sub-contacts.

* * * * *